(12) United States Patent
Kim

(10) Patent No.: US 7,273,780 B2
(45) Date of Patent: Sep. 25, 2007

(54) SEMICONDUCTOR DEVICE HAVING BOX-SHAPED CYLINDRICAL STORAGE NODES AND FABRICATION METHOD THEREOF

(75) Inventor: Sang-Ho Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 233 days.

(21) Appl. No.: 11/137,440

(22) Filed: May 26, 2005

(65) Prior Publication Data

US 2005/0285176 A1      Dec. 29, 2005

(30) Foreign Application Priority Data

Jun. 24, 2004   (KR)   .................. 10-2004-0047895

(51) Int. Cl.
*H01L 21/8242*   (2006.01)
*H01L 21/20*     (2006.01)
*H01L 21/76*     (2006.01)

(52) U.S. Cl. .................. 438/253; 438/244; 438/396; 438/445

(58) Field of Classification Search ............... 438/253, 438/244, 396, 445, 190, 239, 250
See application file for complete search history.

(56) References Cited

U.S. PATENT DOCUMENTS

| | | | |
|---|---|---|---|
| 3,830,279 A | * | 8/1974 | Arbenz et al. ............... 164/7.1 |
| 5,386,382 A | | 1/1995 | Ahn |
| 6,329,683 B2 | | 12/2001 | Kohyama |
| 7,074,718 B2 | * | 7/2006 | Kim et al. ................... 438/639 |
| 2004/0082178 A1 | * | 4/2004 | Kamins et al. ............. 438/691 |
| 2004/0156108 A1 | * | 8/2004 | Chou et al. ................. 359/566 |

FOREIGN PATENT DOCUMENTS

| | | |
|---|---|---|
| JP | 06-077430 | 3/1994 |
| KR | 1995-0028147 | 10/1995 |
| KR | 1997-0053887 | 7/1997 |
| KR | 1999-0040040 | 6/1999 |

* cited by examiner

*Primary Examiner*—Chuong Anh Luu
(74) *Attorney, Agent, or Firm*—Volentine & Whitt, P.L.L.C.

(57) ABSTRACT

A method of forming box-shaped cylindrical storage nodes includes forming an interlayer insulating layer on a semiconductor substrate. Buried contact plugs are formed to penetrate the interlayer insulating layer. A molding layer and a photoresist layer are then sequentially formed on the substrate. Using a first phase shift mask having line-and-space patterns, the photoresist layer is exposed, forming first exposure regions. Using a second phase shift mask having line-and-space patterns, the photoresist layer is exposed again, forming second exposure regions intersecting the first exposure regions. The photoresist layer is then developed, forming a photoresist pattern having rectangular-shaped openings formed at intersections of the first and the second exposure regions. The molding layer is etched using the photoresist pattern as an etch mask, forming storage node holes exposing the buried contact plugs. Storage nodes are formed inside the storage node holes.

22 Claims, 21 Drawing Sheets

US 7,273,780 B2

SEMICONDUCTOR DEVICE HAVING BOX-SHAPED CYLINDRICAL STORAGE NODES AND FABRICATION METHOD THEREOF

CROSS REFERENCES TO RELATED APPLICATIONS

This application claims priority under 35 U.S.C. § 119 from Korean Patent Application No. 2004-47895, filed on Jun. 24, 2004, the contents of which are hereby incorporated by reference in their entirety for all purposes as if fully set forth herein.

BACKGROUND AND SUMMARY

1. Technical Field

The present invention relates to a semiconductor device and a fabrication method thereof, and more particularly, to a semiconductor device having box-shaped cylindrical storage nodes and a method of fabricating the same.

2. Description of the Related Art

A semiconductor memory device, particularly, a dynamic random access memory (DRAM) device is a memory device for storing data in a unit cell. That is, the unit cell of such a DRAM includes one access transistor and one cell capacitor, which are connected in series. As the integration of such a DRAM is increased, the area of the unit cell is significantly reduced, and thus, the capacitance of the capacitor is also decreased. However, the reduced capacitance of the capacitor negatively impacts the capability to store data. Thus, it may occur that a device having a low capacitance could fail to correctly read the data stored in advance. Therefore, in order to obtain a high performance DRAM device, the capacitance of the capacitor needs to be increased.

In order to increase the capacitance of such a cell capacitor, technologies for increasing the surface area of a storage node to be used as a lower electrode of the cell capacitor have been widely employed. For example, a cylindrical storage node has been normally employed for such a highly-integrated DRAM.

Such a cylindrical storage node and a fabrication method thereof are disclosed in U.S. Pat. No. 6,329,683 entitled "Semiconductor memory device and manufacturing method thereof which make it possible to improve reliability of cell-capacitor and also to simplify the manufacturing processes" to Yusuke Kohyama.

FIG. 1A is a plan view illustrating a structure of a conventional semiconductor device having cylindrical storage nodes, and FIG. 1B is a cross-sectional view taken along a line of I-I' of FIG. 1A.

Referring to FIGS. 1A and 1B, a device isolation layer 15 for isolating an active region "A" is disposed inside a semiconductor substrate 10. The active regions A are aligned with and spaced apart from each other at uniform intervals, and each active region A has a major axis L1 and a minor axis L2. A gate insulating layer 20 is disposed on the semiconductor substrate having the device isolation layer 15 formed thereon. Gate electrodes 25 are disposed on the gate insulating layer 20. The gate electrodes 25 are disposed to intersect above the active regions A. A gate protecting layer 30 is disposed on the semiconductor substrate having the gate electrodes 25 formed thereon. Source regions "S" and drain regions "D" are disposed between the gate electrodes 25, inside the active regions. An interlayer insulating layer 40 is disposed to cover the gate protecting layer 30. Buried contact plugs 45 are disposed to penetrate the interlayer insulating layer 40 and to be in contact with the source regions S respectively.

Being in contact with the buried contact plugs 45 respectively, oval-shaped cylindrical storage nodes 55 are disposed to extend upwardly. Although in some drawings, the cylindrical storage nodes in the disclosure of U.S. Pat. No. 6,329,683 may be shown to have a rectangular-shape when viewed from above, because the storage nodes are fabricated by a contact method, even though the initial design shape of the storage node may be rectangular, after fabrication the cylindrical storage nodes have round-shaped (rounded) corners. Therefore, as shown in FIG. 1A, the storage nodes 55 have an oval-shaped cylindrical structure. An etch stop layer 50 is disposed on the interlayer insulating layer 40, between the oval-shaped cylindrical storage nodes 55.

As shown in the drawings, the oval-shaped cylindrical storage nodes 55 are aligned such that a major axis Y1 of each oval-shaped cylindrical storage node is in parallel with the major axis L1 of the active region A. However, the design width of the capacitor is reduced as the integration of the device is increased, and thus, the space for the oval shape of the storage node 55 in the direction of a minor axis Y2 is significantly also reduced. Therefore, a defect such as is shown as B1 in FIG. 1 may occur, in which the oval-shaped space of the storage node 55 in the minor axis Y2 may overlap. Or, a bridge defect may occur, such as is shown as B2 in FIG. 1, in which the interval between neighboring storage nodes is reduced, so that the storage nodes collapse. Therefore, to address these defects, circular-shaped cylindrical storage nodes have been proposed recently instead of the oval-shaped cylindrical storage nodes. However, the surface area of the circular-shaped cylindrical storage nodes is reduced compared with that of the oval-shaped cylindrical storage nodes, thereby decreasing the capacitance of the capacitor. Furthermore, because the conventional storage nodes are fabricated by a contact method, even though the design of the mask is rectangular-shaped during the exposure process, the actual patterns that are formed have round-shaped corners, so that the storage nodes resultingly have a smaller surface area than that of the initially designed patterns. Therefore, there is a need to minimize the defect generation rates due to collapsed storage nodes, while increasing the capacitance of the capacitor within the limited space area.

Accordingly, it would be desirable to provide a semiconductor device suitable to minimizing the defect generation rates due to collapsed storage nodes, while increasing the capacitance of its capacitor within the restricted area, and a method of fabricating the same.

In one aspect of the present invention, a method of fabricating a semiconductor device includes forming an interlayer insulating layer on a semiconductor substrate. Buried contact plugs are formed to penetrate the interlayer insulating layer. A molding layer and a photoresist layer are sequentially formed on the semiconductor substrate having the buried contact plugs formed thereon. Using a first phase shift mask having line-and-space type patterns, the photoresist layer is exposed, thereby forming first exposure regions. Using a second phase shift mask having line-and-space type patterns, the photoresist layer having the first exposure regions is exposed, thereby forming second exposure regions intersecting the first exposure regions. The photoresist layer having the first and the second exposure regions is developed, thereby forming a photoresist pattern having rectangular-shaped openings, and the rectangular-shaped openings are formed at cross points of the first and the second exposure regions. The molding layer is etched using the photoresist pattern as an etch mask, thereby forming storage node holes exposing the buried contact plugs. Storage nodes are formed inside the storage node holes.

After forming the molding layer, the method may further include forming a hard mask layer on the molding layer. The formation of storage node holes may include patterning the hard mask layer using the photoresist pattern, thereby forming a hard mask pattern. Then, the molding layer may be etched using the hard mask pattern as an etch mask, thereby forming storage node holes exposing the buried contact plugs.

The hard mask layer may be formed of a material layer having an etch selectivity relative to the molding layer.

Beneficially, the thickness of the first exposure regions or the second exposure regions is smaller than the thickness of the photoresist layer, and the thickness of the overlapping exposure regions of the first exposure regions and the second exposure regions is the same as the thickness of the photoresist layer.

Beneficially, the pattern intervals of the line-and-space type patterns in the first phase shift mask and the second phase shift mask are the same.

After forming the buried contact plugs, the method may further include forming buffer conductive layer patterns on the semiconductor substrate having the buried contact plugs formed thereon, the buffer conductive layer patterns being in contact with the buried contact plugs and having a wider area. The step of forming the storage node holes may include etching the molding layer using the photoresist pattern as an etch mask, thereby forming storage node holes exposing the buffer conductive layer patterns.

After forming the buried contact plugs, the method may further include forming an etch stop layer on the semiconductor substrate having the buried contact plugs. The step of forming the storage node holes may include sequentially etching the molding layer and the etch stop layer using the photoresist pattern as an etch mask, thereby forming storage node holes exposing the buried contact plugs.

After forming the storage node holes, the method may further include cleaning the inside of the storage node holes using a wet cleaning solution.

In another aspect, the present invention provides a method of fabricating a semiconductor device having box-shaped cylindrical storage nodes. The method includes forming an interlayer insulating layer on a semiconductor substrate. Buried contact plugs are formed to penetrate the interlayer insulating layer. A molding layer, a first hard mask layer, and a second hard mask layer are sequentially formed on the semiconductor substrate having the buried contact plugs formed thereon. The second hard mask layer is patterned, thereby forming line-and-space type upper hard mask patterns. The first hard mask layer is patterned, thereby forming line-and-space type lower hard mask patterns intersecting the upper hard mask patterns. The molding layer is etched using the upper and the lower hard mask patterns as etch masks, thereby forming storage node holes exposing the buried contact plugs. Storage nodes are formed inside the storage node holes.

The pattern intervals of the line-and-space type patterns in the lower hard mask patterns and the upper hard mask patterns may be same.

The first hard mask layer may be formed of a material layer having an etch selectivity relative to the molding layer.

The second hard mask layer may be formed of a material layer having an etch selectivity relative to the molding layer.

The second hard mask layer may be formed of a material layer having an etch selectivity relative to the first hard mask layer.

After forming the buried contact plugs, the method may further include forming buffer conductive layer patterns on the semiconductor substrate having the buried contact plugs formed thereon, and the buffer conductive layer patterns are in contact with the buried contact plugs and are wider than the contact plugs. The step of forming the storage node holes includes etching the molding layer using the upper and the lower hard mask patterns as etch masks, thereby forming storage node holes exposing the buffer conductive layer patterns.

After forming the buried contact plugs, the method may further include forming an etch stop layer on the semiconductor substrate having the buried contact plugs. The step of forming the storage node holes includes sequentially etching the molding layer and the etch stop layer using the upper and the lower hard mask patterns as etch masks, thereby forming storage node holes exposing the buried contact plugs.

After forming the storage node holes, the method may further include cleaning the inside of the storage node holes using a wet cleaning solution.

In yet another aspect, the present invention provides a method of fabricating a semiconductor device having box-shaped cylindrical storage nodes. The method includes forming an interlayer insulating layer on a semiconductor substrate. Buried contact plugs are formed to penetrate the interlayer insulating layer. A molding layer and a hard mask layer are sequentially formed on the semiconductor substrate having the buried contact plugs formed thereon. The hard mask layer is patterned, thereby forming line-and-space type hard mask patterns. A photoresist layer is formed on the semiconductor substrate having the hard mask patterns. The photoresist layer is patterned, thereby forming line-and-space type photoresist patterns intersecting the hard mask patterns. The molding layer is etched using the photoresist patterns and the hard mask patterns as etch masks, thereby forming storage node holes exposing the buried contact plugs. Storage nodes are formed inside the storage node holes.

The pattern intervals of the line-and-space type patterns in the photoresist patterns and the hard mask patterns may be same.

Preferably, the hard mask patterns is formed of a material layer having an etch selectivity relative to the molding layer.

After forming the buried contact plugs, the method may further include forming buffer conductive layer patterns on the semiconductor substrate having the buried contact plugs formed thereon, and the buffer conductive layer patterns are in contact with the buried contact plugs and are wider than the contact plugs. The step of forming the storage node holes includes etching the molding layer using the photoresist patterns and the hard mask patterns as etch masks, thereby forming storage node holes exposing the buffer conductive layer patterns.

After forming the buried contact plugs, the method may further include forming an etch stop layer on the semiconductor substrate having the buried contact plugs. The step of forming the storage node holes includes sequentially etching the molding layer and the etch stop layer using the photoresist patterns and the hard mask patterns as etch masks, thereby forming storage node holes exposing the buried contact plugs.

After forming the storage node holes, the method may further include cleaning the inside of the storage node holes using a wet cleaning solution.

In yet another aspect of the present invention, a semiconductor device is provided having box-shaped cylindrical storage nodes. The semiconductor device includes active regions disposed inside a semiconductor substrate with spaced in uniform intervals. Each active region has a major axis and a minor axis. MOS transistors are disposed on the active regions. An interlayer insulating layer is disposed on the semiconductor substrate having the MOS transistors formed thereon. Are disposed buried contact plugs penetrating the interlayer insulating layer, and being in contact with source regions of the MOS transistors respectively. Box-shaped cylindrical storage nodes are disposed on the buried contact plugs, and each storage node has opposite corners being aligned in parallel with the major axis of the active regions.

Preferably, the box-shaped cylindrical storage nodes have rectangular shapes or rhombus shapes when viewed from the plan view.

The semiconductor device may further include buffer conductive layer patterns on the buried contact plugs. The buffer conductive layer patterns are in contact with the buried contact plugs respectively and are wider than the contact plugs. Box-shaped cylindrical storage nodes having opposite corners being in parallel with the major axes of the active regions are disposed on the buffer conductive layer patterns Etch stop layers may be disposed on the interlayer insulating layer under the outer sidewalls of the box-shaped cylindrical storage nodes.

BRIEF DESCRIPTION OF THE DRAWINGS

The above and other features and advantages of the present invention will become more apparent to those of ordinary skill in the art by describing in detail preferred embodiments thereof with reference to the attached drawings in which:

FIGS. 2A to 2I are perspective views illustrating a method of fabricating a semiconductor device having box-shaped cylindrical storage nodes according to a first embodiment;

DETAILED DESCRIPTION

Figure 1A:
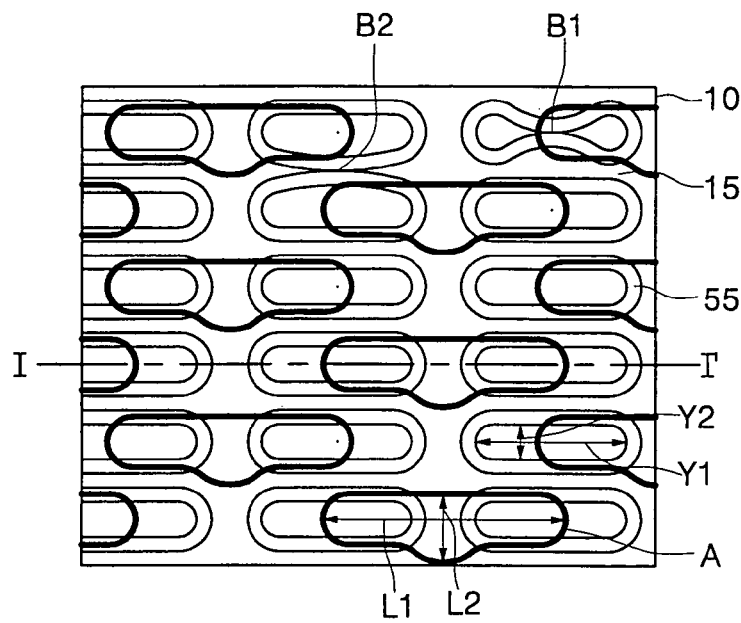
FIG. 1A is a plan view illustrating a structure of a conventional semiconductor device having cylinder storage nodes.
Figure 1B:
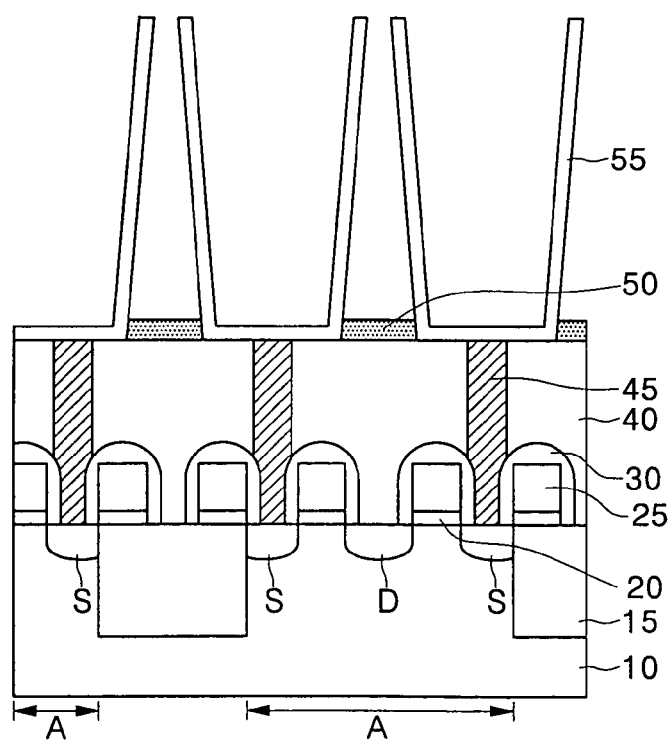
FIG. 1B is a sectional view taken along a line of I-I' of FIG. 1A.

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

FIGS. 2A to 2I are perspective views illustrating a method of fabricating a semiconductor device having box-shaped cylindrical storage nodes according to a first embodiment.

Figure 2A:
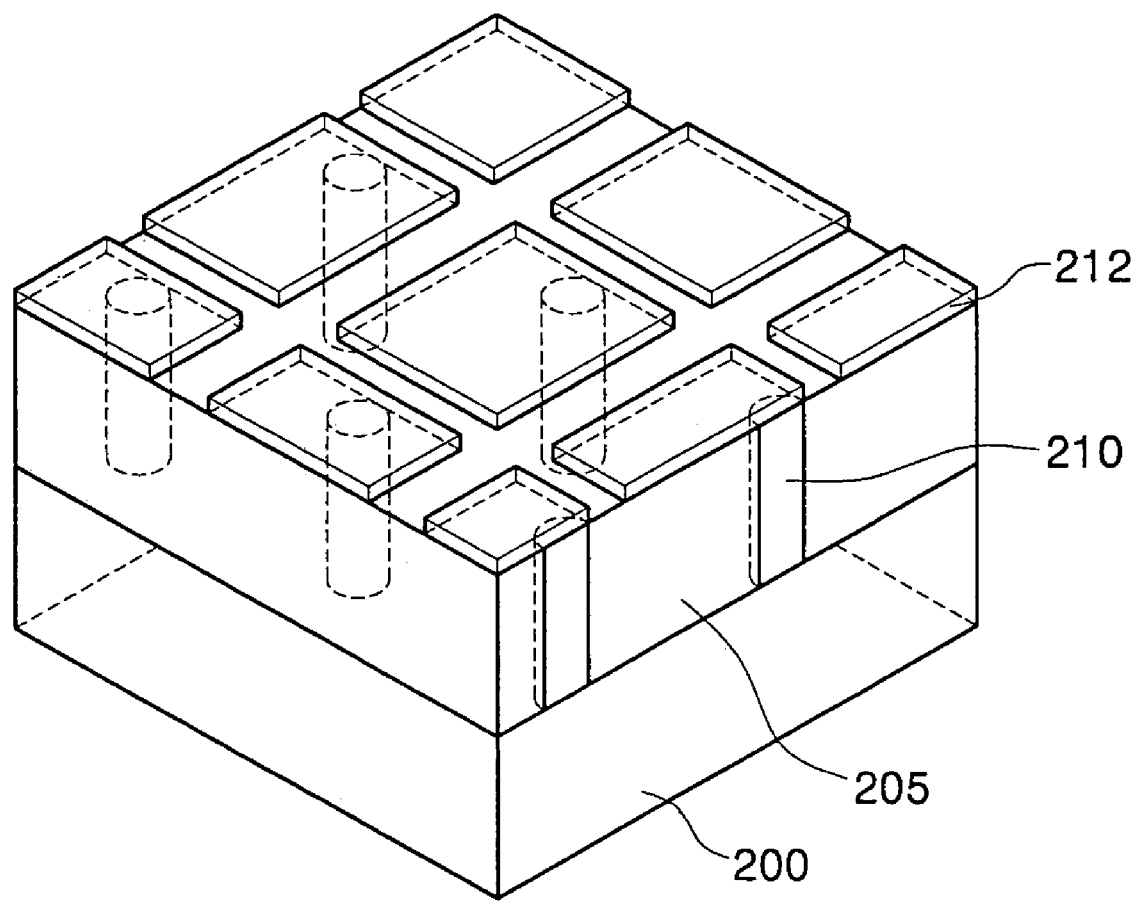

Referring to FIG. 2A, an interlayer insulating layer 205 is formed on a semiconductor substrate 200. The interlayer insulating layer 205 may be formed of an oxide layer, BPSG (borophosphosilicate glass) or PSG (phosphosilicate glass). Buried contact plugs 210 are formed to penetrate the interlayer insulating layer 205. The buried contact plugs 210 may comprise polysilicon. The buried contact plugs 210 have the same height as the thickness of the interlayer insulating layer 205. Beneficially, a buffer conductive layer is formed on the semiconductor substrate 200 having the buried contact plugs 210 formed thereon. The buffer conductive layer may comprise polysilicon. The buffer conductive layer is patterned, thereby forming buffer conductive layer patterns 212 being in contact with the buried contact plugs 210 respectively, and each having a greater width than that of the plugs 210. The buffer conductive layer patterns 212 are formed in order to prevent contact failures between storage nodes to be formed later, and the buried contact plugs 210.

Figure 2B:
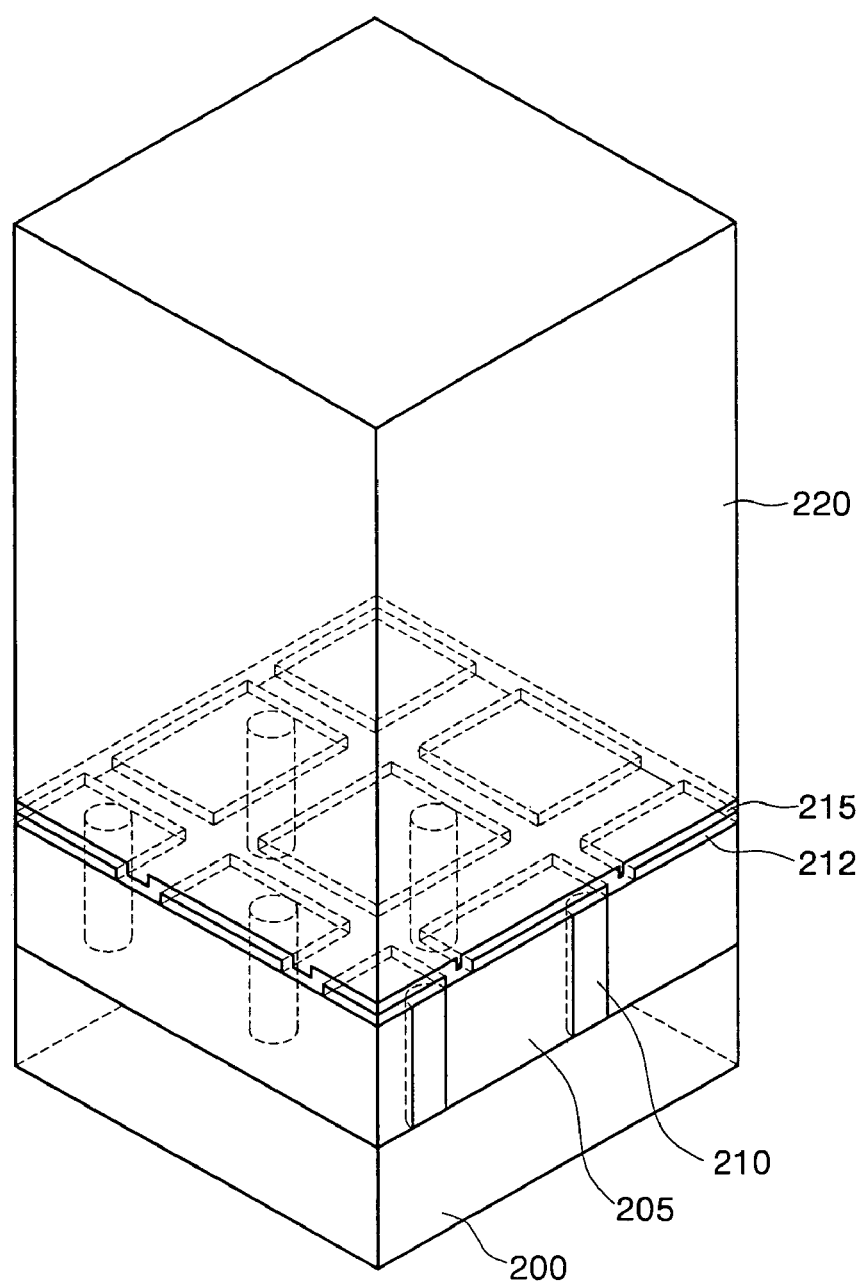

Referring to FIG. 2B, an etch stop layer 215 is formed on the semiconductor substrate having the buffer conductive layer patterns 212 formed thereon. The etch stop layer 215 may be formed of a silicon nitride layer. A molding layer 220 is formed on the etch stop layer 215. The molding layer 220 is formed on the etch stop layer 215. The molding layer 220 may be formed of an oxide layer, BPSG, or PSG.

Figure 2C:
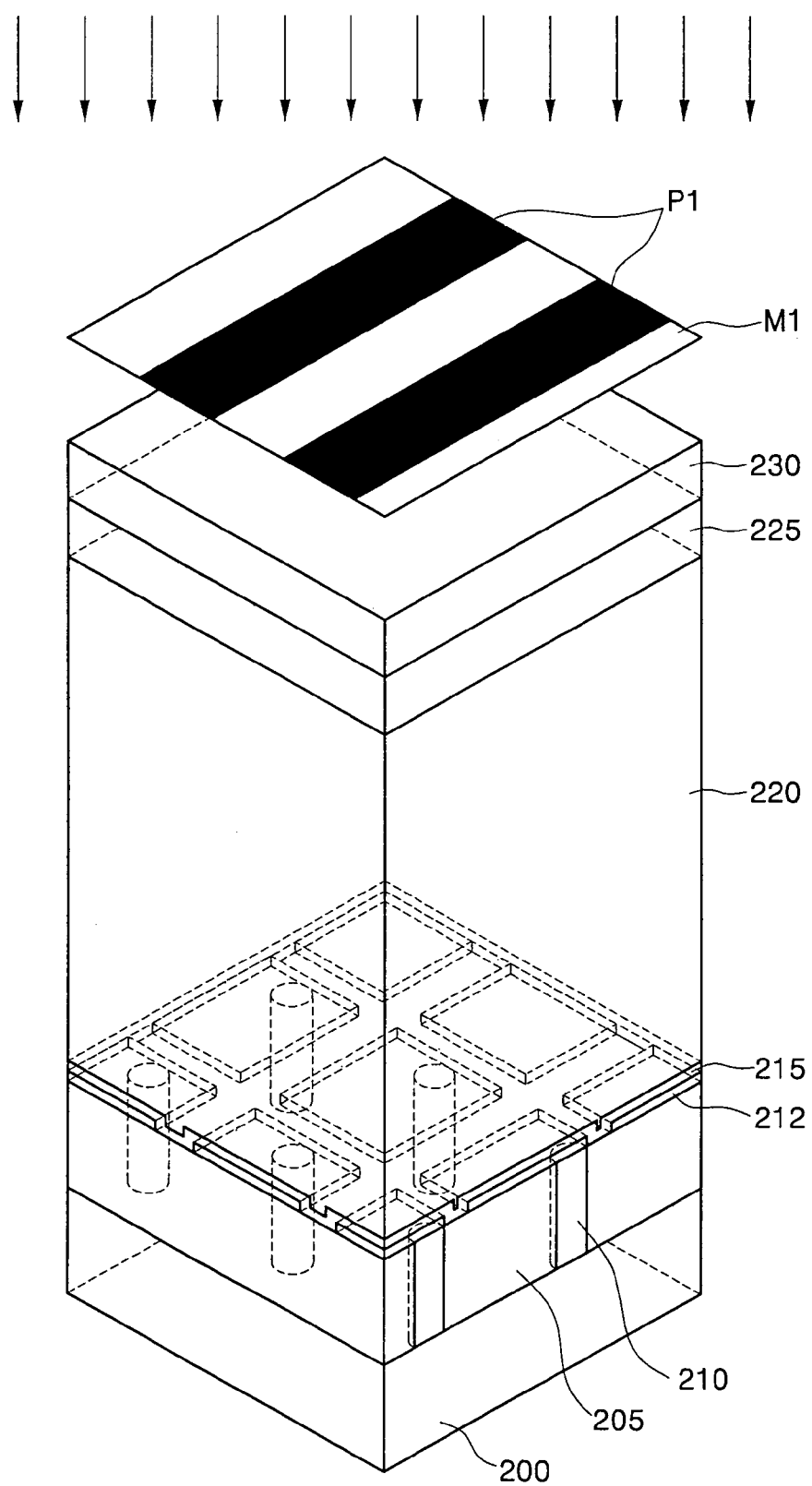

Referring to FIG. 2C, beneficially a hard mask layer 225 may be formed on the molding layer 220. The hard mask layer 225 is beneficially formed of a material layer having an etch selectivity relative to the molding layer 220. The hard mask layer 225 may be formed of a silicon nitride layer or a polysilicon layer. A photoresist layer 230 is formed on the hard mask layer 225. The photoresist layer 230 is exposed using a first phase shift mask M1. The first phase shift mask M1 has a plurality of line-shaped patterns. The plurality of line-shaped patterns are preferably aligned in parallel with each other. The amount of the light passing through light shielding patterns P1 of the first phase shift mask M1 is preferably set to form an exposure region being smaller in thickness than the thickness of the photoresist layer 230. For example, if the transmittance of the light passing all through the photoresist layer 230 in the direction along its thickness is 100%, the transmittance of the light passing through the light shielding patterns P1 is preferably 90% or less.

Figure 2D:
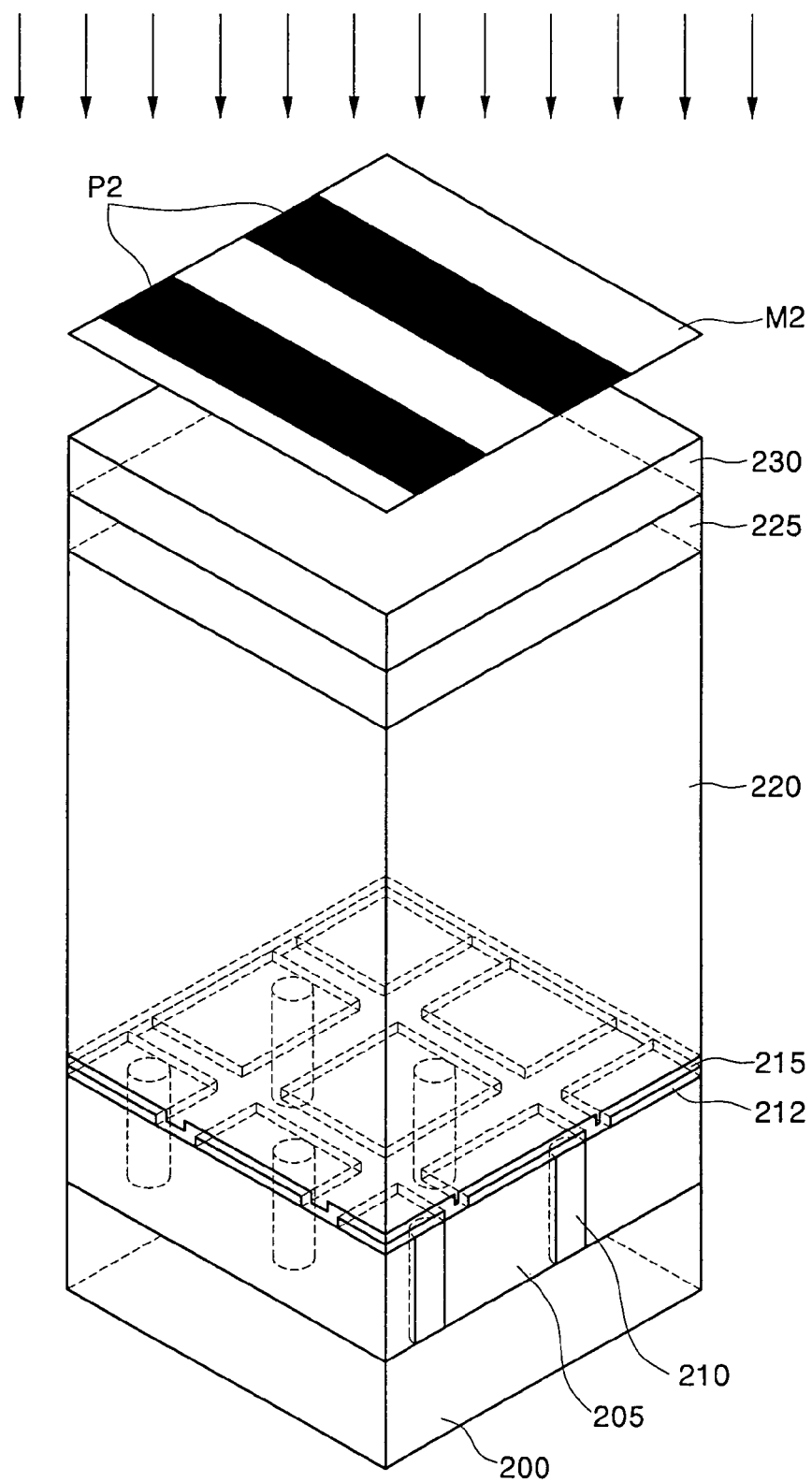

Referring to FIG. 2D, the exposed photoresist layer 230 is again exposed using a second phase shift mask M2 which also has a plurality of line-shaped patterns. The plurality of line-shaped patterns are preferably shaped for each line pattern to be aligned in parallel with each other. Every interval between the line-shaped patterns in the first phase shift mask M1 and the second phase shift mask M2 may be the same.

The mask M2 is beneficially aligned such that the line-shaped patterns of the mask M2 are at an angle with respect to the orientation of the line-shaped patterns of mask M1 used during the first exposure.

The amount of the light passing through light shielding patterns P2 of the second phase shift mask M2 is preferably set to form an exposure region being smaller in thickness than the thickness of the photoresist layer 230. For example, if the transmittance of the light passing all through the photoresist layer 230 in the direction along its thickness is 100%, the transmittance of the light passing through the light shielding patterns P2 is preferably 90% or less.

The portions of the photoresist layer 230, which are dually exposed by the first phase shift mask M1 and the second phase shift mask M2, are preferably all removed in a development process following after the exposure process. For example, if the portion of the photoresist layer 230 exposed by the first phase shift mask M1 is 50% or more in its thickness, and the portion of the photoresist layer 230 exposed by the second phase shift mask M2 is 50% or more in its thickness, the portion of the photoresist layer 230, which is dually exposed by the two masks, is 100% or more in its thickness. Meanwhile, the portion of the photoresist layer 230, which is exposed only one time by either the first phase shift mask M1 or the second phase shift mask M2, remains with a thickness smaller than the initial thickness of the layer after a subsequent development process.

Figure 2E:
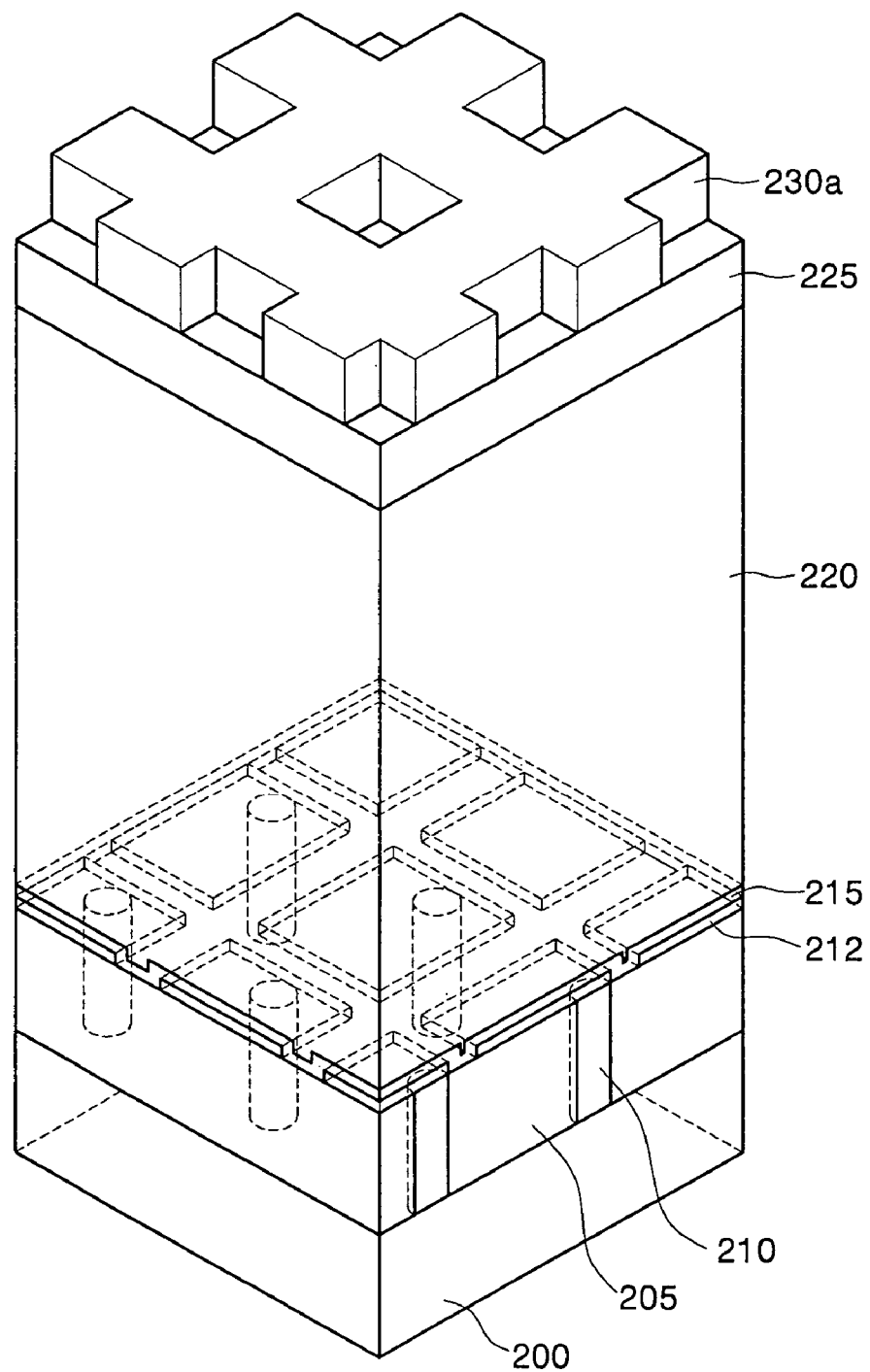

Referring to FIG. 2E, the exposed photoresist layer 230 is treated sequentially with a post-exposure bake process and a development process. As a result, a photoresist pattern 230a is formed having a plurality of rectangular-shaped holes with a predetermined uniform size. Therefore, the height or thickness of the photoresist pattern 230a may depend on the transmittance of the light passing through the light shielding patterns P1, P2 of the first phase shift mask M1 and the second phase shift mask M2.

Figure 2F:
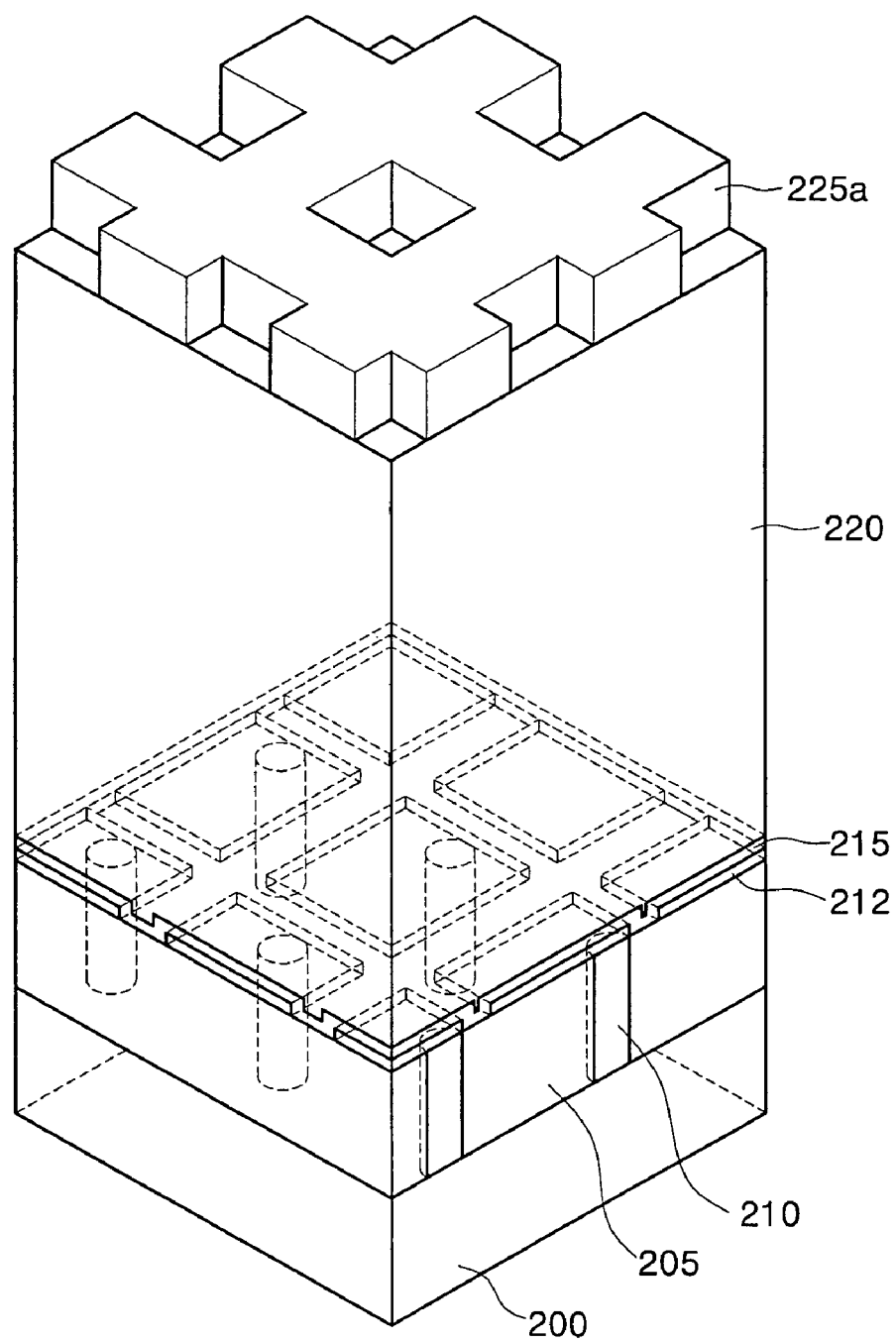

Referring to FIG. 2F, using the photoresist pattern 230a as an etch mask, the hard mask layer 225 is etched. Thus, a hard mask pattern 225a having the same shape as that of the photoresist pattern 230a is formed. Then, the photoresist pattern 230a may be removed.

Figure 2G:
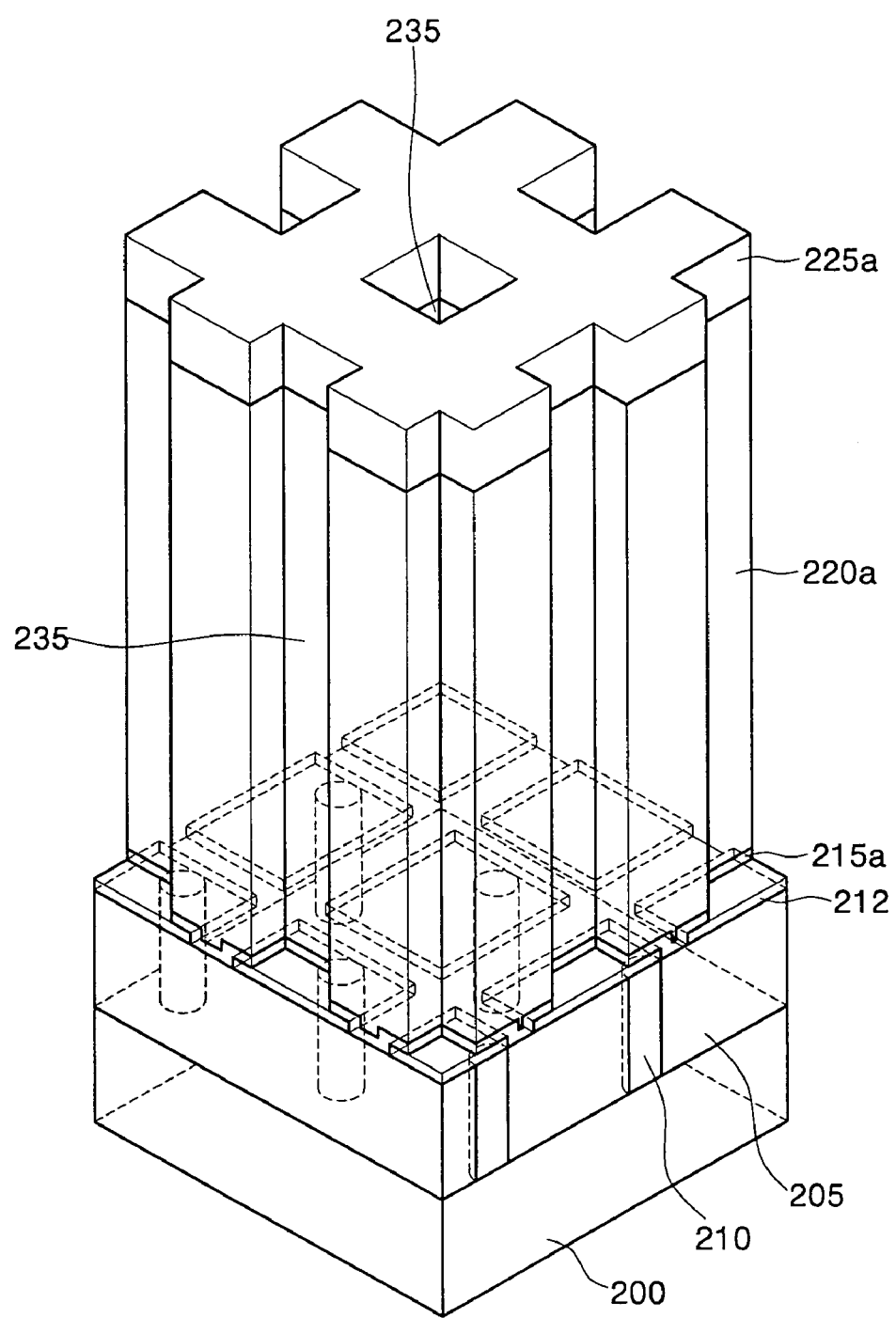

Referring to FIG. 2G, using the hard mask pattern 225a as an etch mask, the molding layer 220 and the etch stop layer 215 are sequentially etched. As a result, a molding layer pattern 220a having storage node holes 235 and an etch stop layer pattern 215a are formed. Further, the storage node holes 235 expose the buffer conductive layer patterns 212.

Figure 2H:
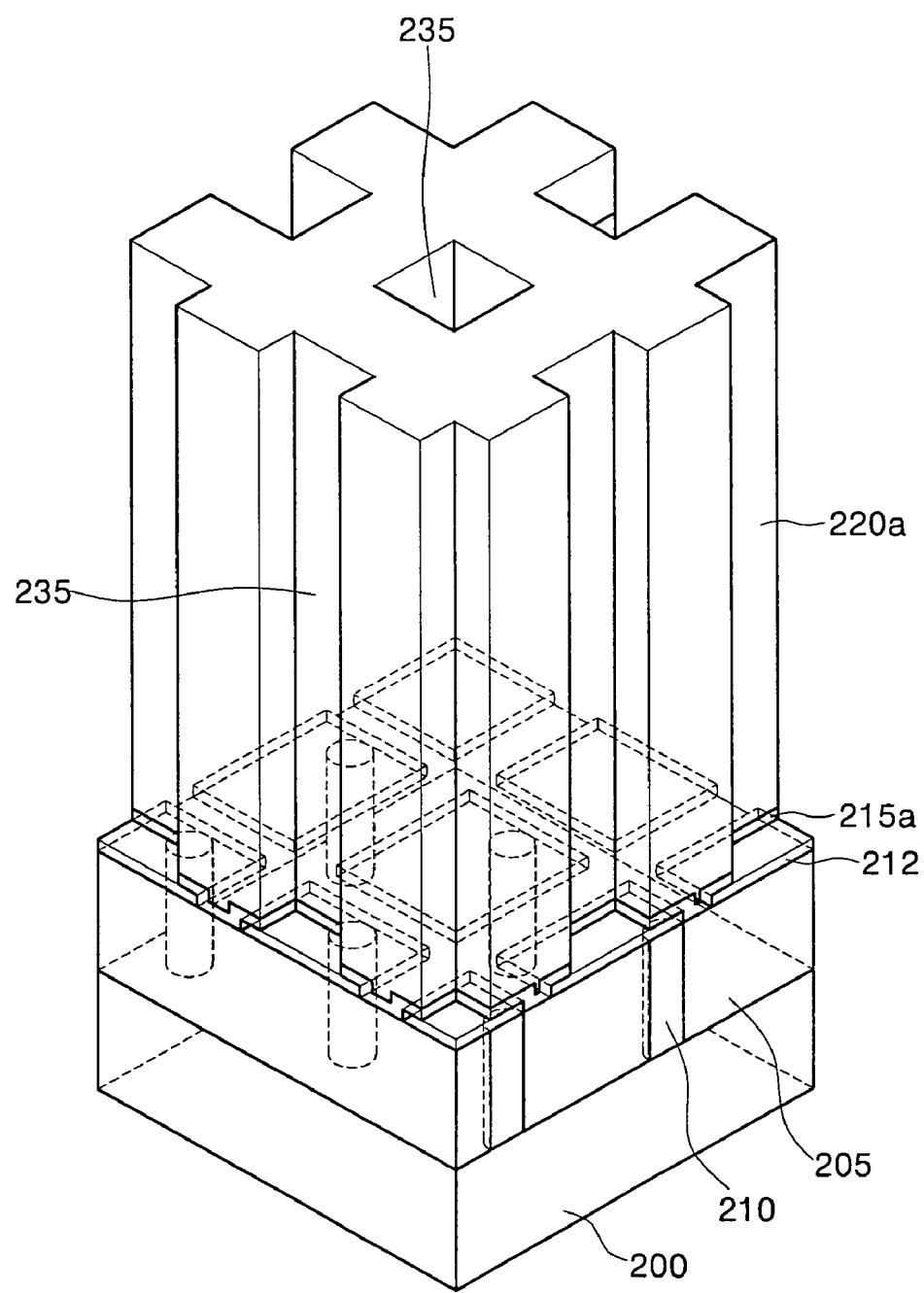
Figure 21:
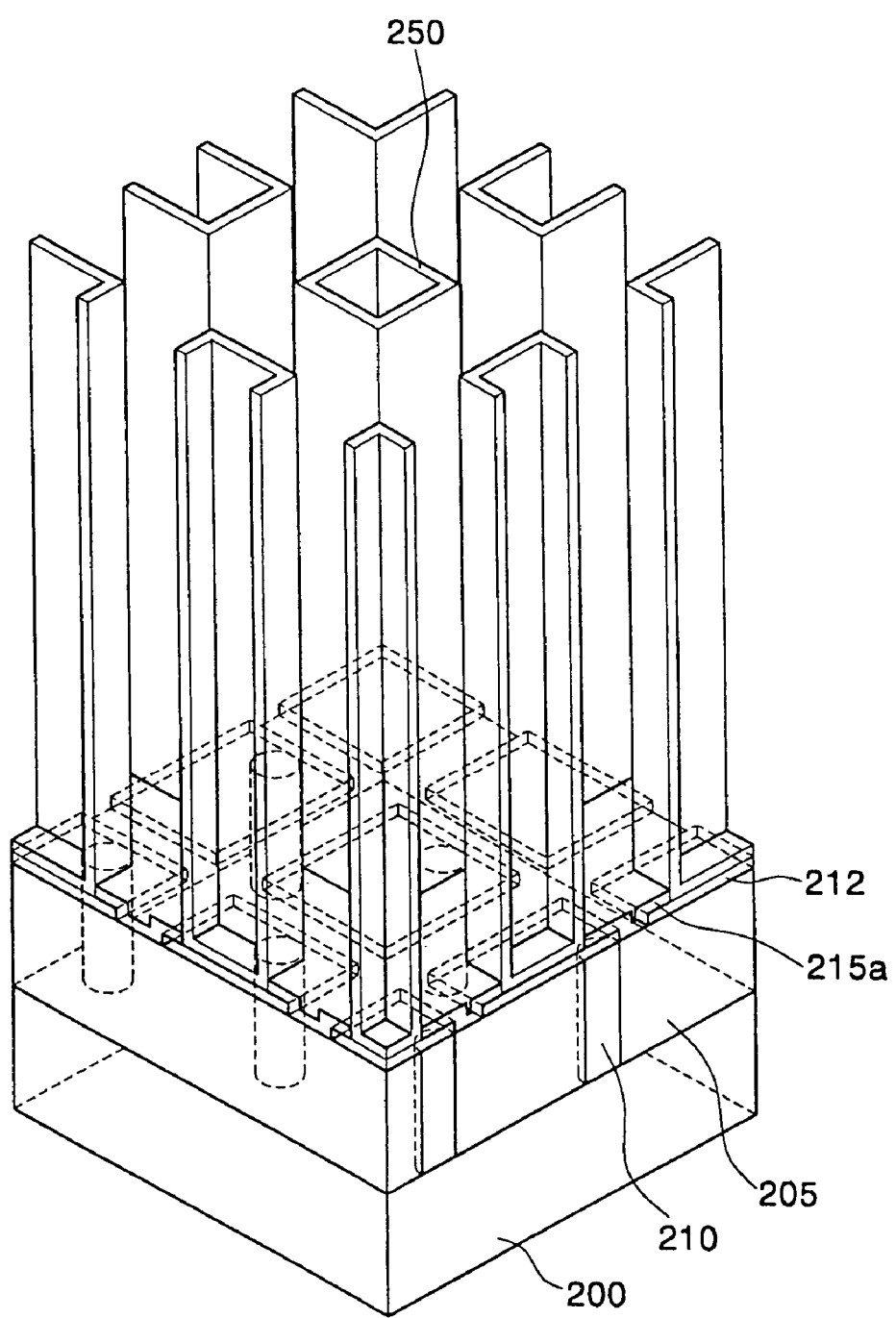

Referring to FIG. 2H, the hard mask pattern 225a is removed. Then, the semiconductor substrate having the storage node holes 235 may be cleaned using a cleaning solution. By the cleaning process, a natural oxide layer and contaminants formed on the surface of the exposed buffer conductive layer patterns 212 are removed. Generally, the cleaning process uses a chemical solution containing hydrofluoric acid. Thus, the molding layer 220a exposed by the storage node holes 235 can be isotropically etched by the cleaning solution. Therefore, enlarged storage node holes having greater widths than those of the storage node holes 235 may be formed.

Next, a conformal storage node layer (not shown) is formed on the semiconductor substrate 200 having the enlarged storage node holes. The storage node layer may be formed of a polysilicon layer having excellent step coverage characteristics. Then, referring to FIG. 2I, storage nodes 250 are formed out of the storage node layer in a typical formation process.

As a result, the storage nodes result in having box-shaped cylindrical shapes when the first phase shift mask M1 and the second phase shift mask M2 are aligned with their spatial line-shaped patterns (hereinafter, referred to as line-and-space type patterns) arranged at an angle with respect to each other. In the case where the first phase shift mask M1 is aligned with respect to the second phase shift mask M2 at an angle of 90°, the storage nodes have rectangular shapes when viewed from above (plan view). Alternatively, in the case where the first phase shift mask M1 is aligned with respect to the second phase shift mask M2 at an angle of 60°, the storage nodes have rhombus shapes when viewed from above (plan view). Therefore, box-shaped cylindrical storage nodes as above can be formed. The box-shaped cylindrical storage nodes have a greater surface area than that of conventional oval type or circular type of storage nodes in a restricted area. Therefore, an increase in the capacitance of the capacitor can be accomplished, thereby realizing a high performance DRAM device.

Further, an ArF illuminating system is used during an exposure process in the conventional contact type method in order to fabricate such a cylinder capacitor having a design width of 100 nm or less, and in the line-and-space type method described above, the existing ArF illuminating system also can be also used during the exposure process for the device having a design width of 100 nm or less.

FIGS. 3A to 3E are perspective views illustrating a method of fabricating a semiconductor device having box-shaped cylindrical storage nodes according to a second embodiment.

Figure 3A:
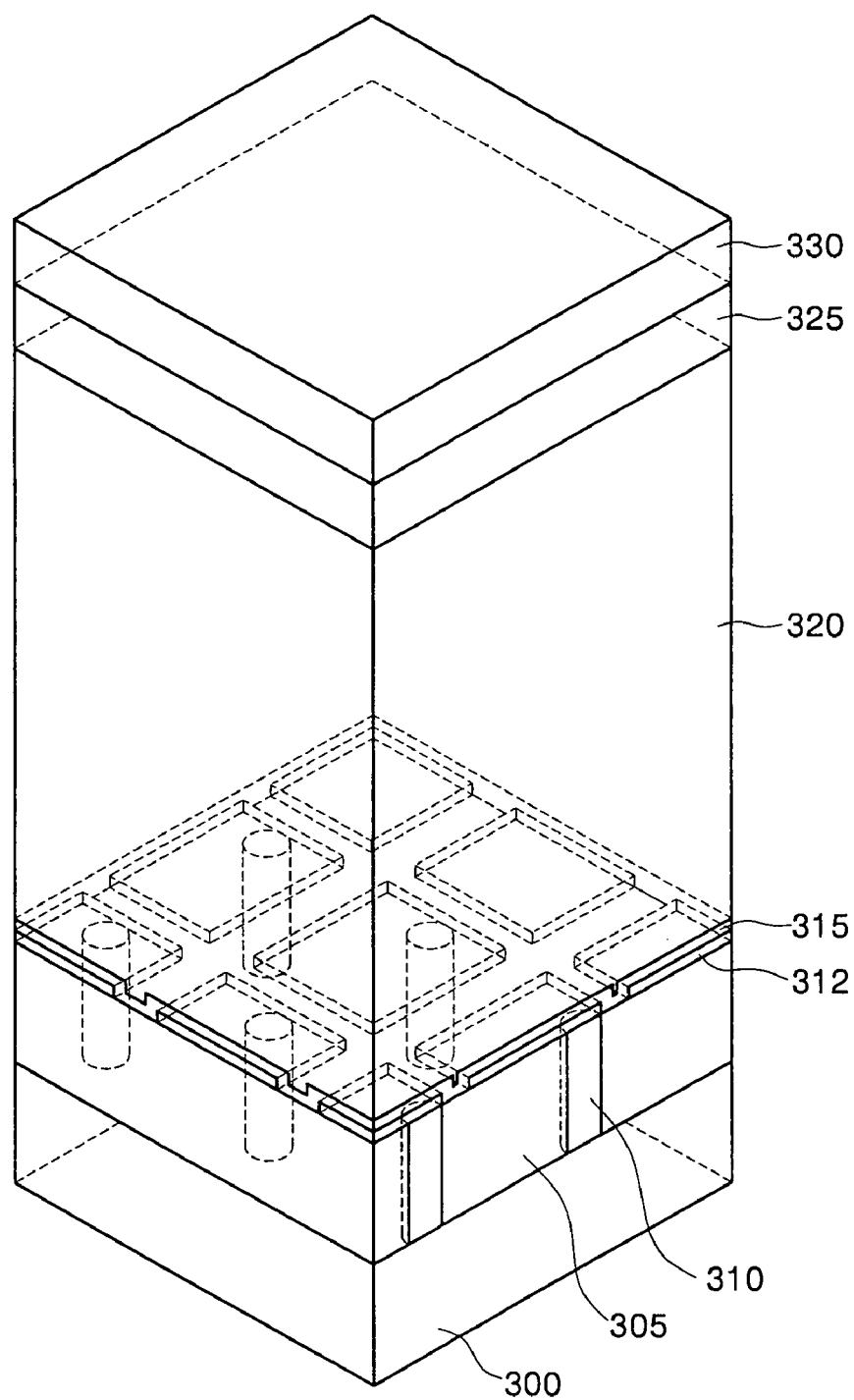
FIGS. 3A to 3E are perspective views illustrating a method of fabricating a semiconductor device having box-shaped cylindrical storage nodes according to a second embodiment.

Referring to FIG. 3A, an interlayer insulating layer 305 is formed on a semiconductor substrate 300 as described in reference to FIGS. 2A and 2B. Buried contact plugs 310 are formed to penetrate the interlayer insulating layer 305. Buffer conductive layer patterns 312 are formed on the semiconductor substrate 300 having the buried contact plugs 310 formed thereon, and the buffer conductive layer patterns 312 are in contact with the buried contact plugs 310 respectively, and have a greater width than the buried contact plugs 310. The buffer conductive layer patterns 312 may comprise polysilicon. An etch stop layer 315 may be formed on the semiconductor substrate 300 having the buffer conductive layer patterns 312 formed thereon. The etch stop layer 315 may be formed of a silicon nitride layer. A molding layer 320 is formed on the etch stop layer 315. The molding layer 320 may be formed of an oxide layer, BPSG, or PSG.

Then, a first hard mask layer 325 and a second hard mask layer 330 are sequentially formed on the molding layer 320. The first hard mask layer 325 is beneficially formed of a material layer having an etch selectivity relative to the molding layer 320. Further, the second hard mask layer 330 is beneficially formed of a material layer having an etch selectivity relative to the molding layer 320. The second hard mask layer 330 may be formed of a material layer having an etch selectivity relative to the first hard mask layer 325. The first and the second hard mask layers 325, 330 may be formed of silicon nitride layers, or polysilicon layers, etc.

Figure 3B:
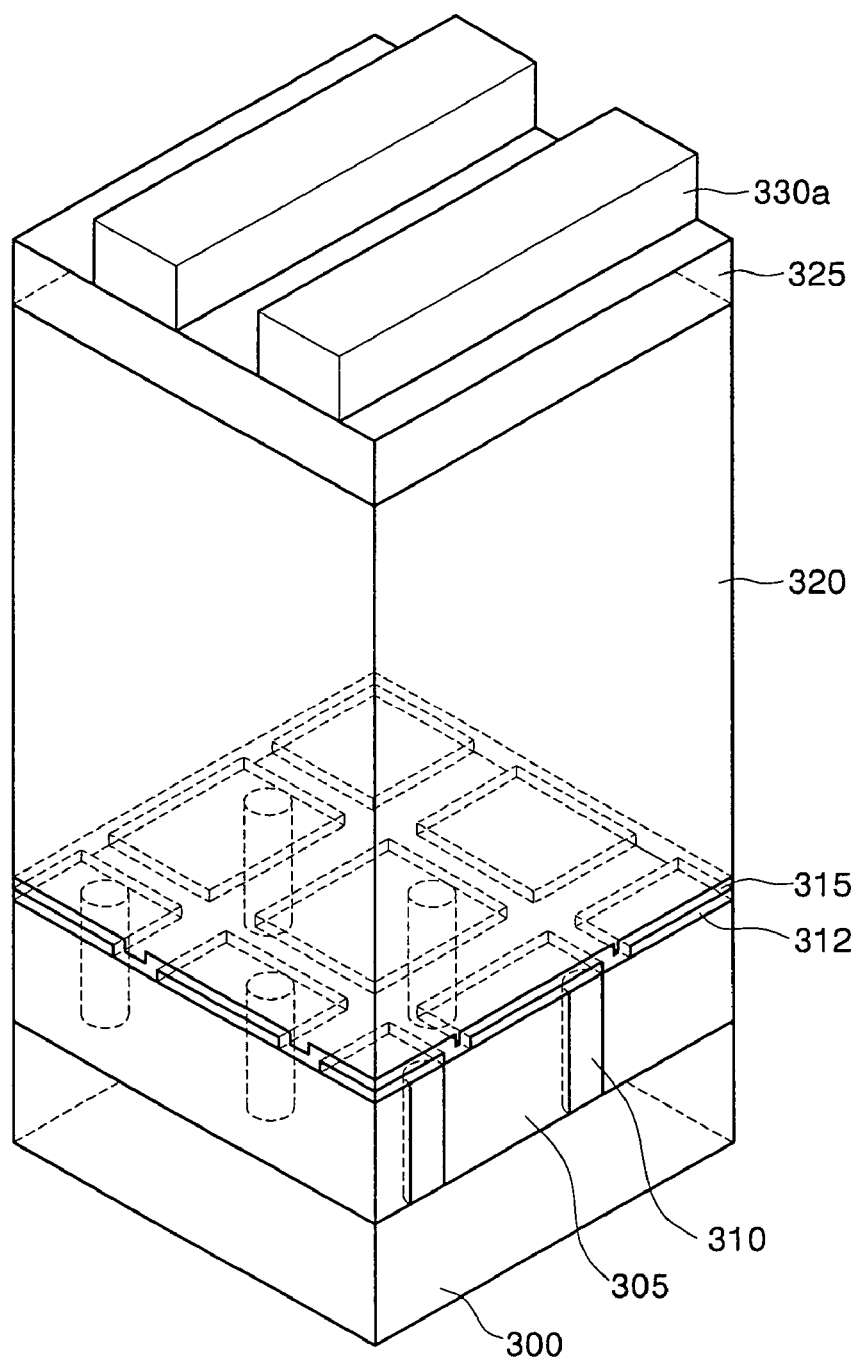

Referring to FIG. 3B, using a first photomask having a plurality of parallel line patterns, the second hard mask layer 330 is patterned, thereby forming a line-and-space type upper hard mask pattern 330a.

Figure 3C:
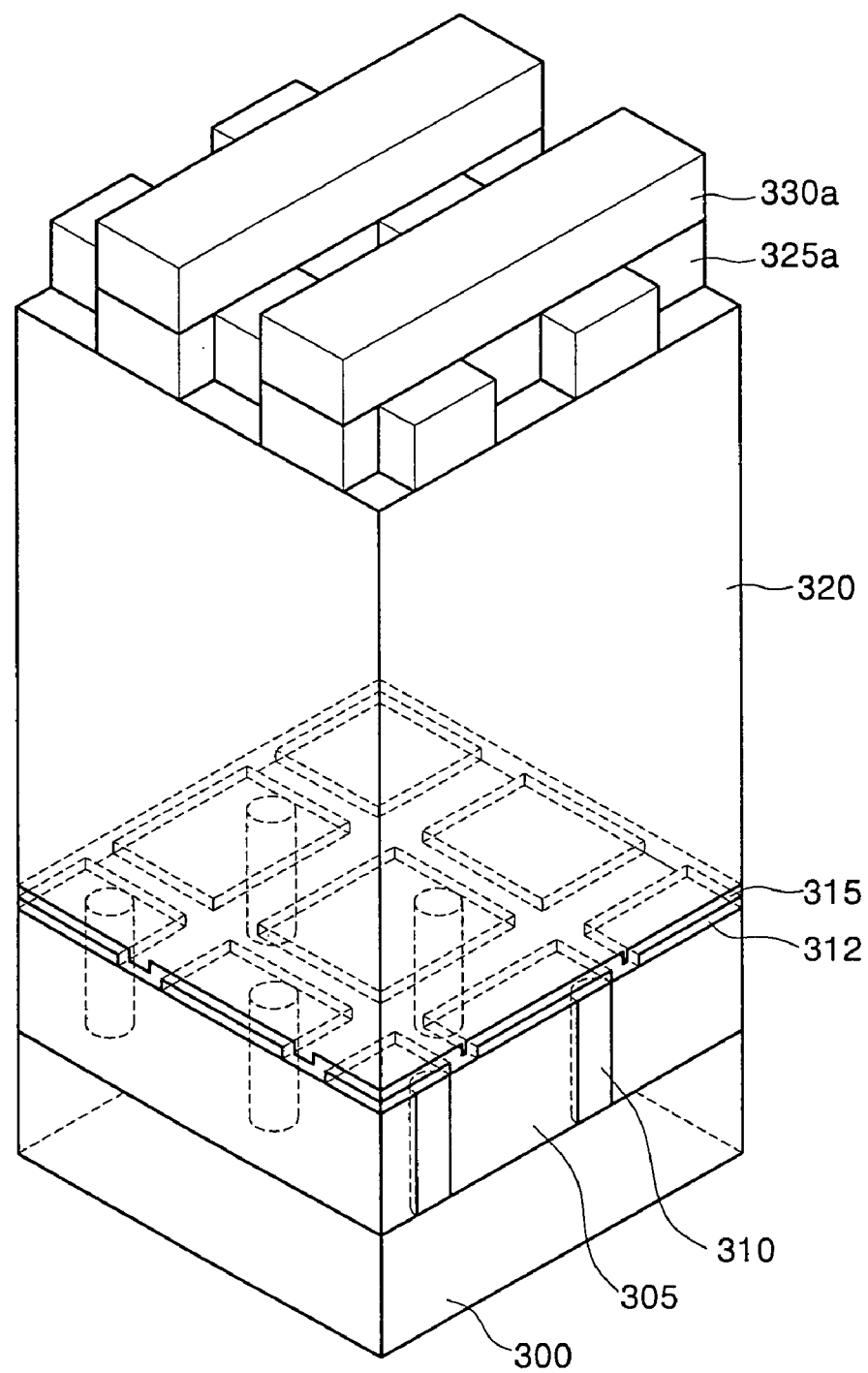

Referring to FIG. 3C, using a second photomask having a plurality of parallel line patterns, the first hard mask layer 325 is patterned, thereby forming a line-and-space type lower hard mask pattern 325a. Beneficially, the second photomask is oriented so that the parallel line patterns of the second photomask are arranged at an angle with respect to the lines of the upper hard mask pattern 330a formed by the first photomask when viewed from above. Beneficially, that angle is either 90°, to form storage nodes having a rectangular shape, or 60° to form storage nodes having a rhombus shape, when viewed from above. The portions of the first hard mask layer 325 disposed directly beneath the upper hard mask pattern 330a are left as they are, being protected by the upper hard mask pattern 330a. The upper surface of the upper hard mask pattern 330a, which is exposed when the lower hard mask pattern 325a is formed, may be partially etched. The intervals of the line-and-space type patterns of the lower hard mask pattern 325a and the upper hard mask pattern 330a may be uniform.

Figure 3D:
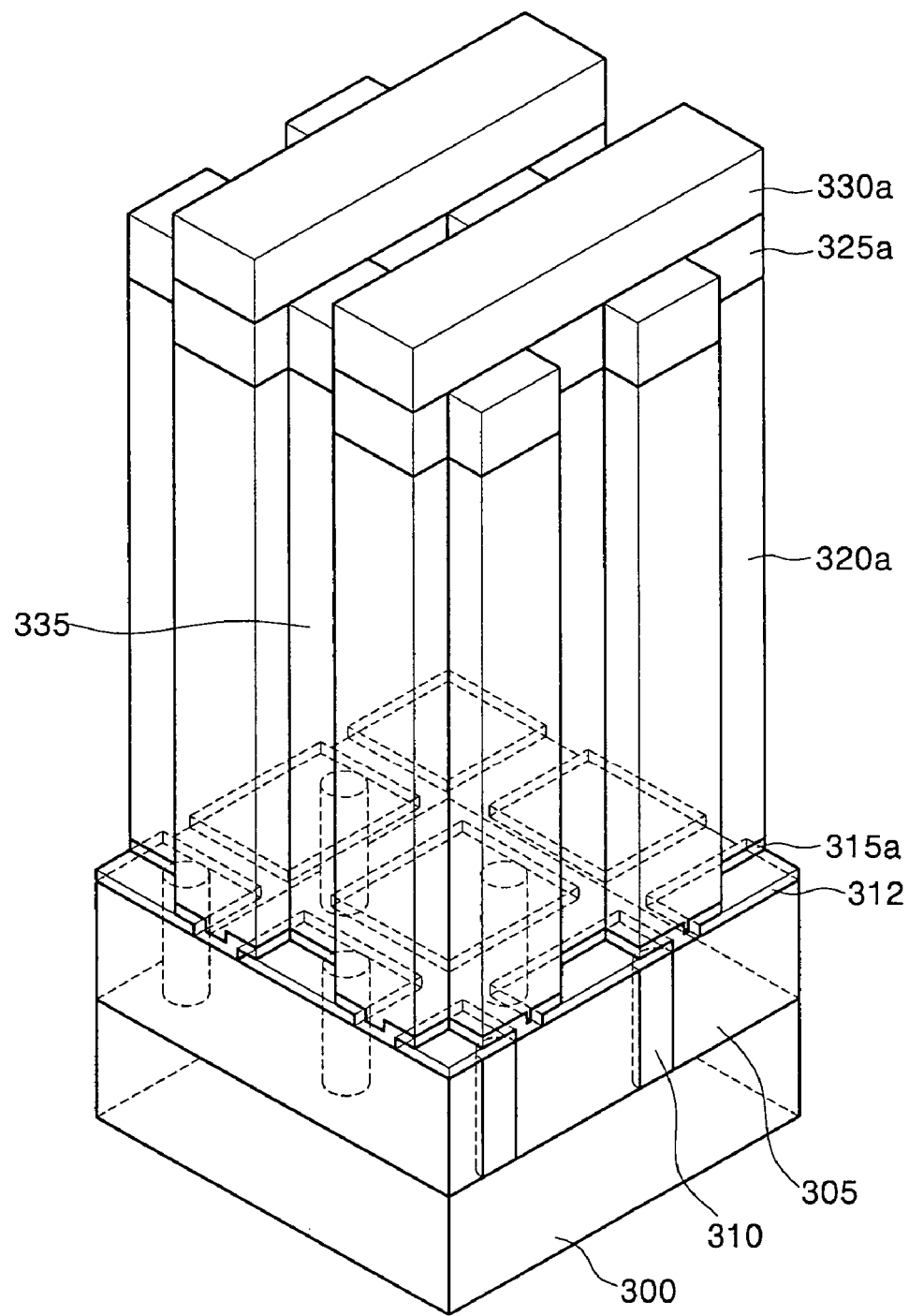
Figure 3E:
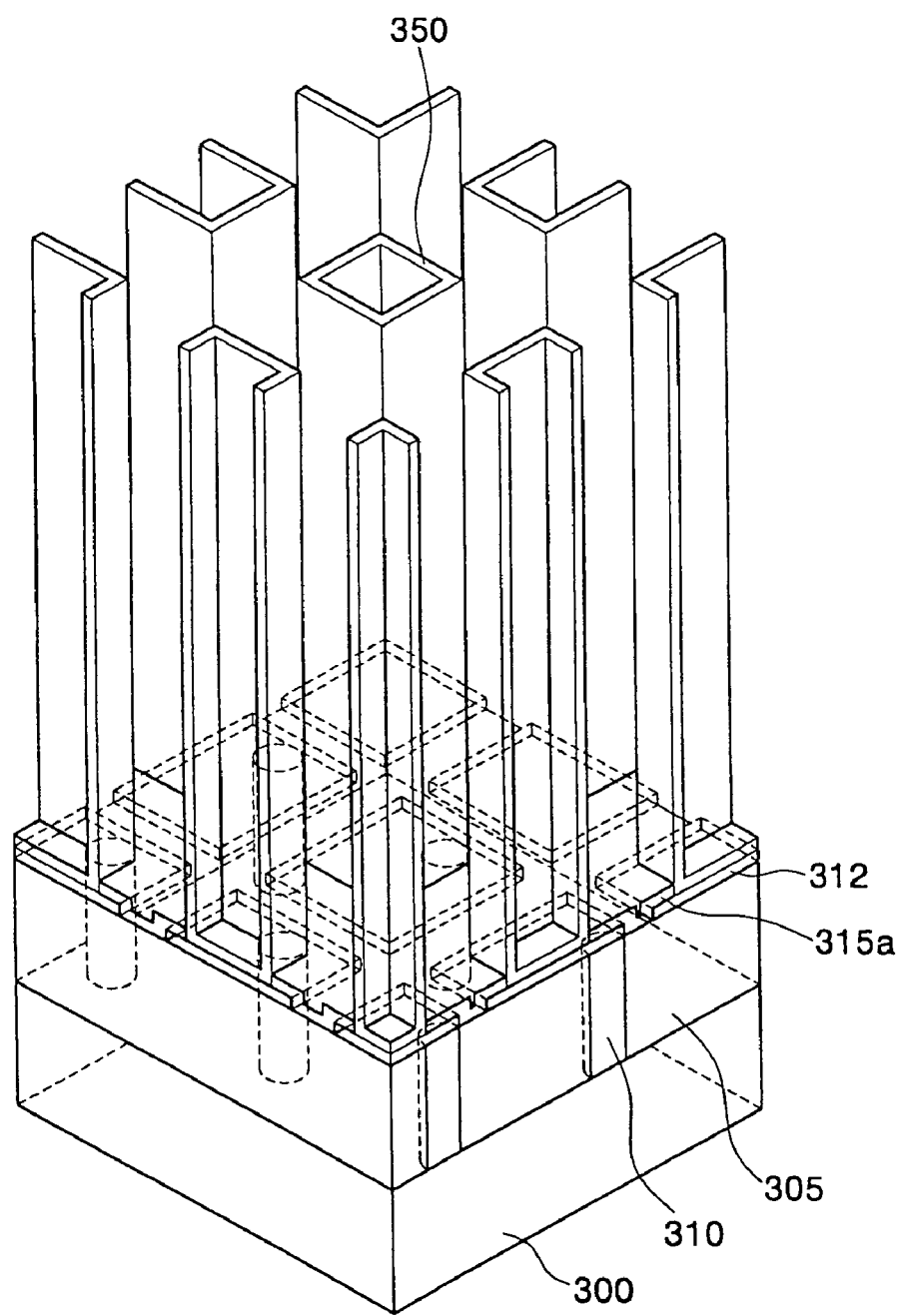

Referring to FIG. 3D, using the lower and the upper hard mask patterns 325a, 330a as etch masks, the molding layer 320 and the etch stop layer 315 are sequentially etched, thereby forming a molding layer pattern 320a having storage node holes 335, and an etch stop layer pattern 315a. Further, the storage node holes 335 expose the buffer conductive layer patterns 312. Then, the lower and the upper hard mask patterns 325a, 330a are removed.

The semiconductor substrate having the storage node holes 335 may be cleaned using a cleaning solution. By the cleaning process, a natural oxide layer and contaminants formed on the surface of the exposed buffer conductive layer patterns 312 are removed. Generally, the cleaning solution process employs a chemical solution containing hydrofluoric acid. Thus, the molding layer 320a exposed by the storage node holes 335 can be isotropically etched by the cleaning solution. Therefore, enlarged storage node holes having greater widths than those of the storage node holes 335 may be formed.

Next, a conformal storage node layer (not shown) is formed on the semiconductor substrate 300 having the enlarged storage node holes. The storage node layer may be formed of a polysilicon layer having excellent step coverage characteristics. Then, referring to FIG. 3E, storage nodes 350 are formed out of the storage node layer in a typical formation process.

FIGS. 4A to 4E are perspective views illustrating a method of fabricating a semiconductor device having box-shaped cylindrical storage nodes according to a third embodiment.

Figure 4A:
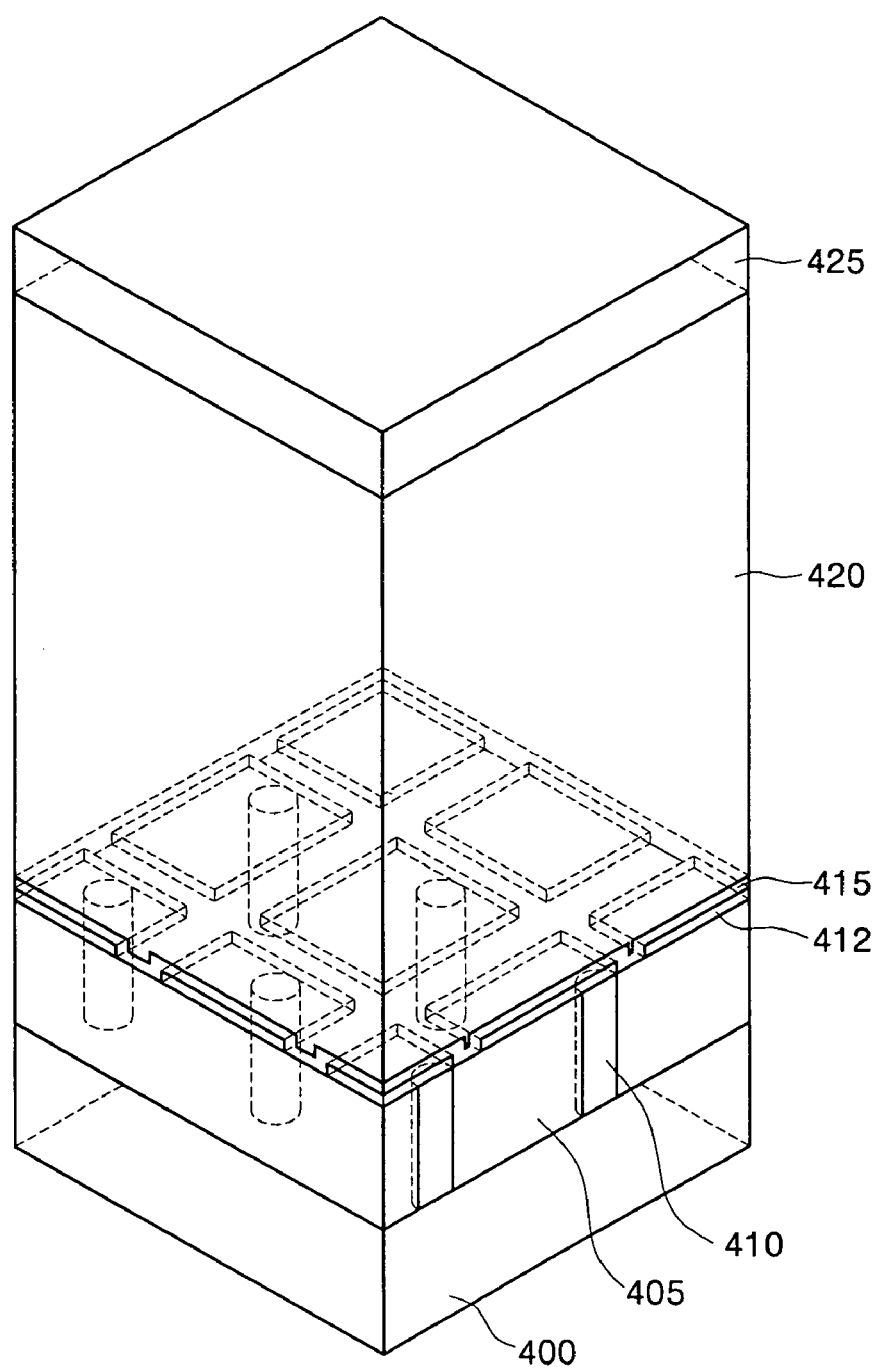
FIGS. 4A to 4E are perspective views illustrating a method of fabricating a semiconductor device having box-shaped cylindrical storage nodes according to a third embodiment.

Referring to FIG. 4A, an interlayer insulating layer 405 is formed on a semiconductor substrate 400 as described in reference to FIGS. 2A and 2B. The interlayer insulating layer 405 may be formed of an oxide layer, BPSG, or PSG. Buried contact plugs 410 are formed to penetrate the interlayer insulating layer 405. The buried contact plugs 410 may comprise polysilicon. The buried contact plugs 410 have the same height as the thickness of the interlayer insulating layer 405. Beneficially, buffer conductive layer patterns 412 are formed on the semiconductor substrate 400 having the buried contact plugs 410 formed thereon, the buffer conductive layer patterns 412 each being in contact with respective ones of the buried contact plugs 410, and having a greater width than the buried contact plugs 410. The buffer conductive layer patterns 412 may comprise polysilicon. Beneficially, an etch stop layer 415 is formed on the semiconductor substrate 400 having the buffer conductive layer patterns 412 formed thereon. The etch stop layer 415 may be formed of a silicon nitride layer. A molding layer 420 is formed on the etch stop layer 415. The molding layer 420 may be formed of an oxide layer, BPSG, or PSG.

Then, a hard mask layer 425 is formed on the molding layer 420. The hard mask layer 425 is preferably formed of a material layer having an etch selectivity relative to the molding layer 420. The hard mask layer 425 may be formed of a silicon nitride layer or a polysilicon layer.

Figure 4B:
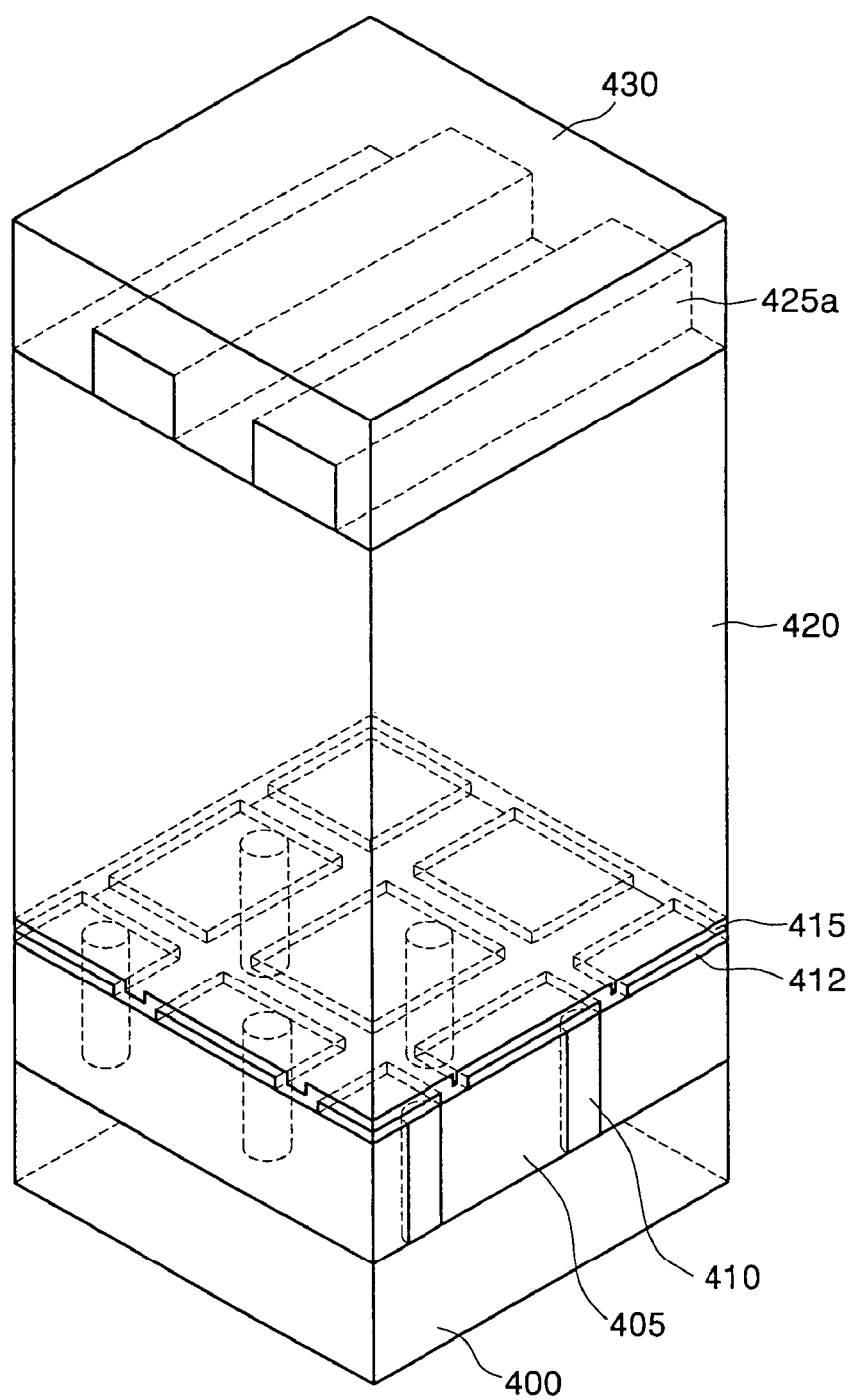

Referring to FIG. 4B, using the same first photomask as described above in reference to FIG. 3B, the hard mask layer 425 is patterned, thereby forming a line-and-space type hard mask pattern 425a. Then, a photoresist layer 430 is formed on the semiconductor substrate having the hard mask pattern 425a.

Figure 4C:
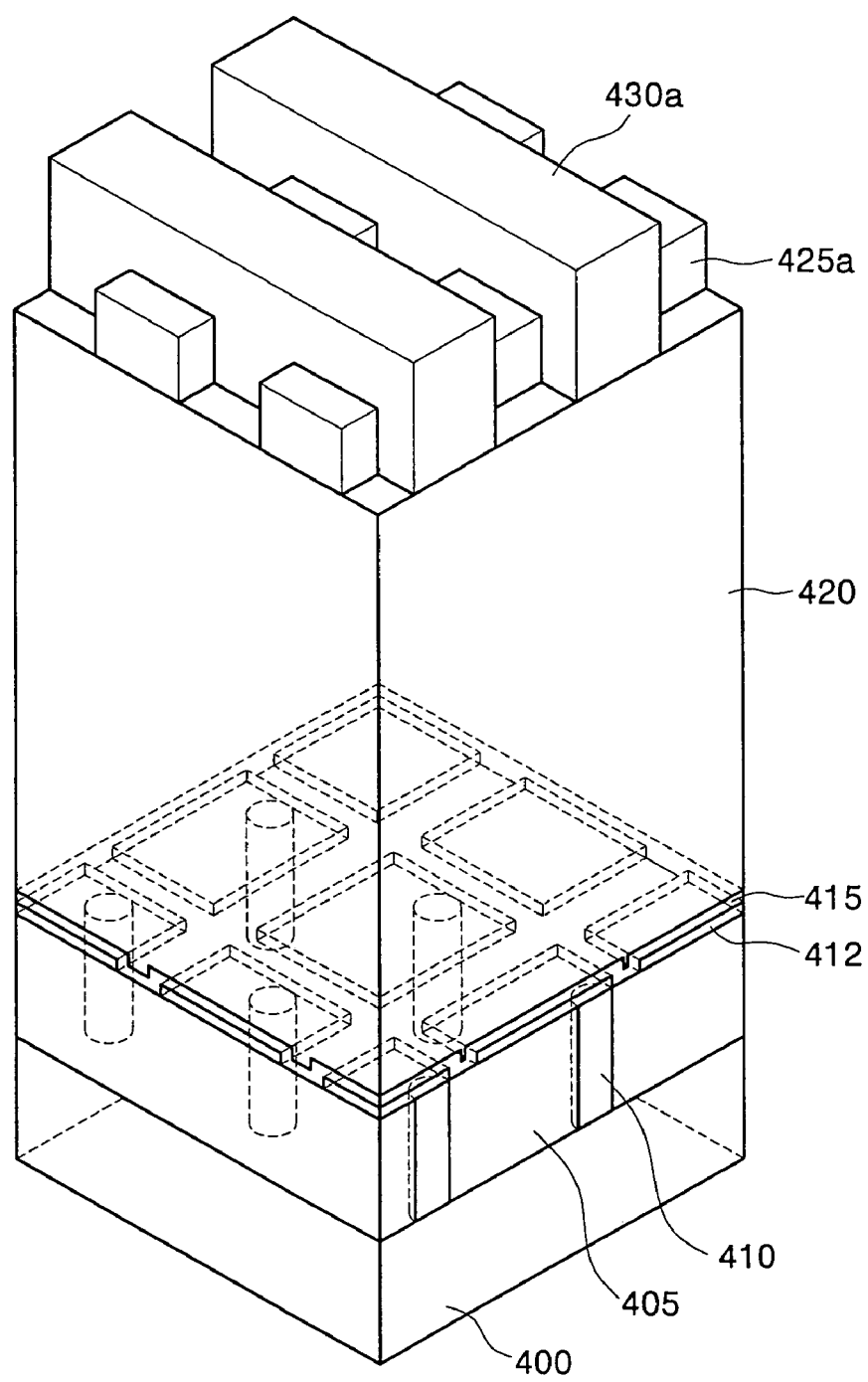

Referring to FIG. 4C, using the same second photomask as described above in reference to FIG. 3C, the photoresist layer 430 is patterned, thereby forming a photoresist pattern 430a having line-and-space type patterns, which are disposed at an angle with respect to the orientation of the line-and-space patterns of the hard mask pattern 425a. The pattern intervals of the line-and-space type patterns in the hard mask pattern 425a and the photoresist pattern 430a may be uniform.

Figure 4D:
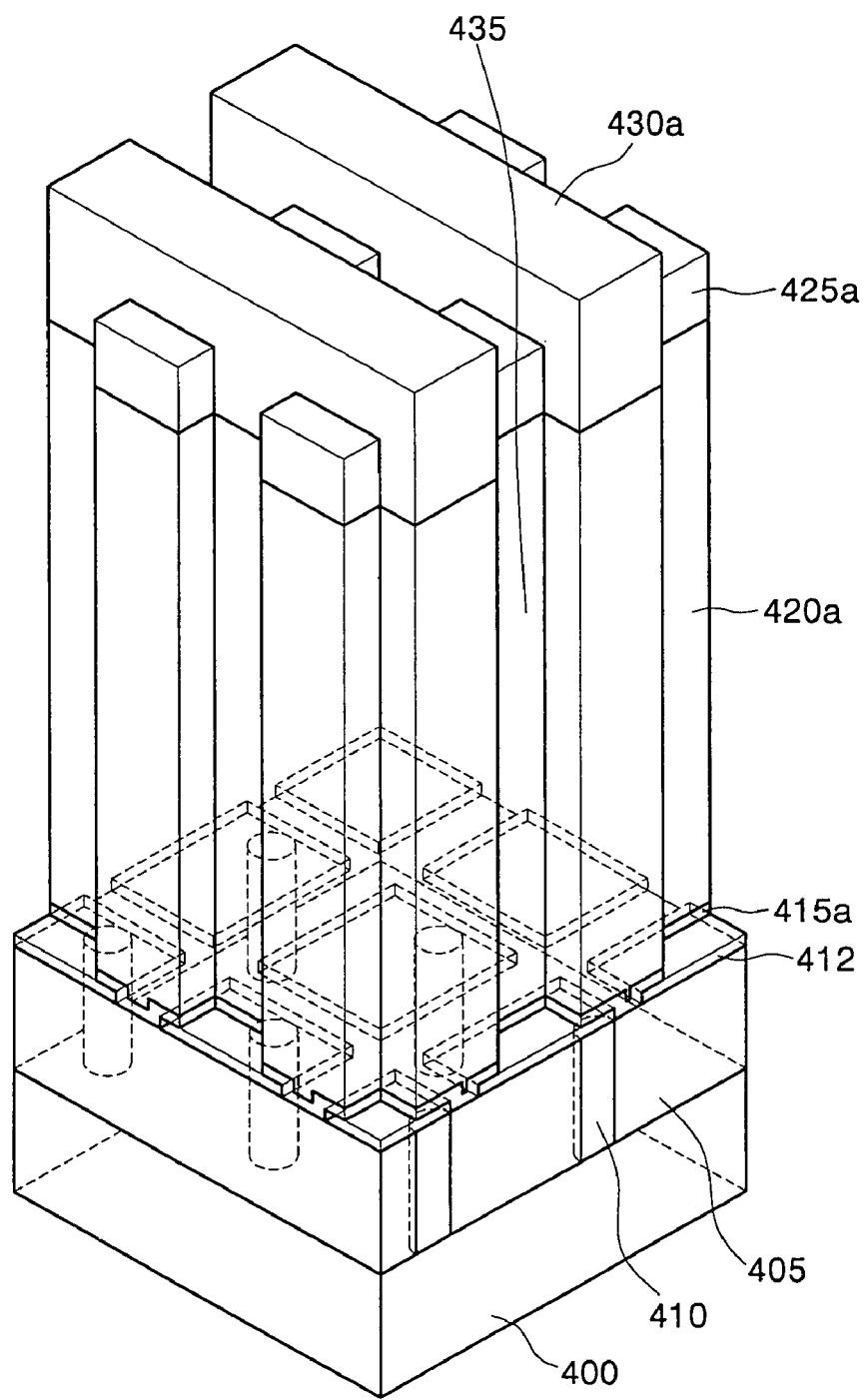
Figure 4E:
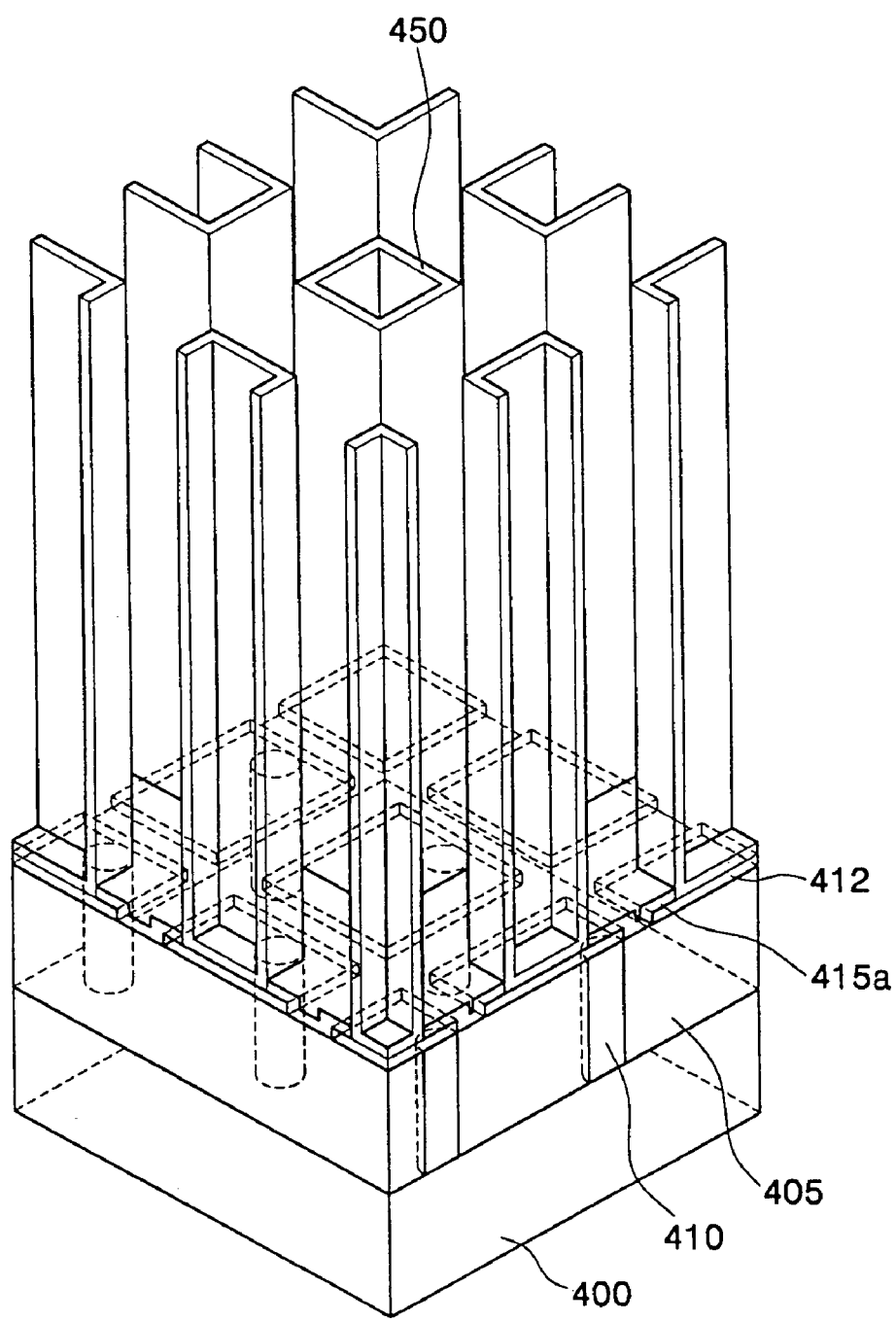

Referring to FIG. 4D, using the hard mask pattern 425a and the photoresist pattern 430a as etch masks, the molding layer 420 and the etch stop layer 415 are sequentially etched, thereby forming a molding layer pattern 420a having storage node holes 435, and an etch stop layer pattern 415a. Further, the storage node holes 435 expose the buffer conductive layer patterns 412. Then, the hard mask pattern 425a and the photoresist pattern 430a are removed.

The semiconductor substrate having the storage node holes 435 may be cleaned using a cleaning solution. By the cleaning process, a natural oxide layer and contaminants formed on the surface of the exposed buffer conductive layer patterns 412 are removed. Generally, the cleaning process uses a chemical solution containing hydrofluoric acid. Thus, the molding layer 420a exposed by the storage node holes 435 can be isotropically etched by the cleaning solution. Therefore, enlarged storage node holes having greater widths than the widths of the storage node holes 435 may be formed.

Next, a conformal storage node layer (not shown) is formed on the semiconductor substrate 400 having the enlarged storage node holes. The storage node layer may be formed of a polysilicon layer having excellent step coverage characteristics. Then, referring to FIG. 4E, storage nodes 450 are formed out of the storage node layer in a typical formation process.

Figure 5A:
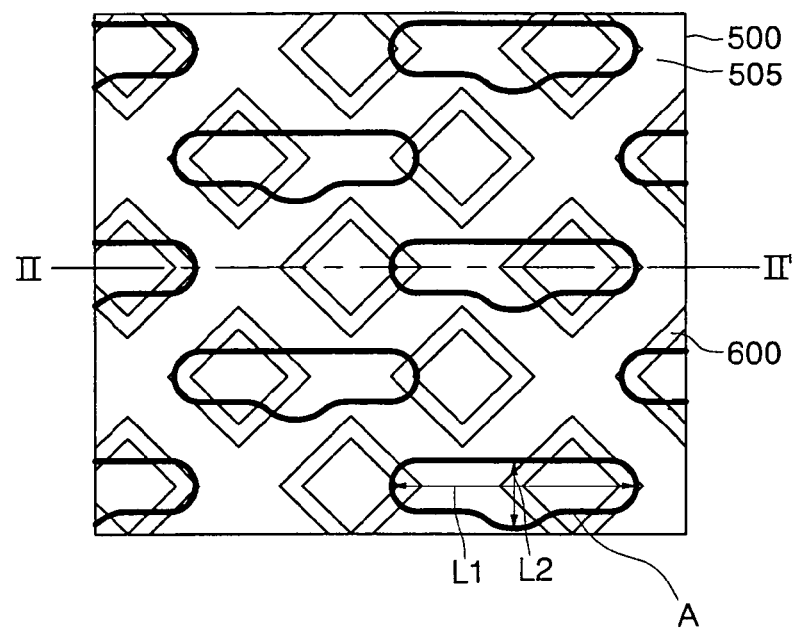
FIG. 5A is a plan view illustrating a structure of a semiconductor device having box-shaped cylindrical storage nodes.
Figure 5B:
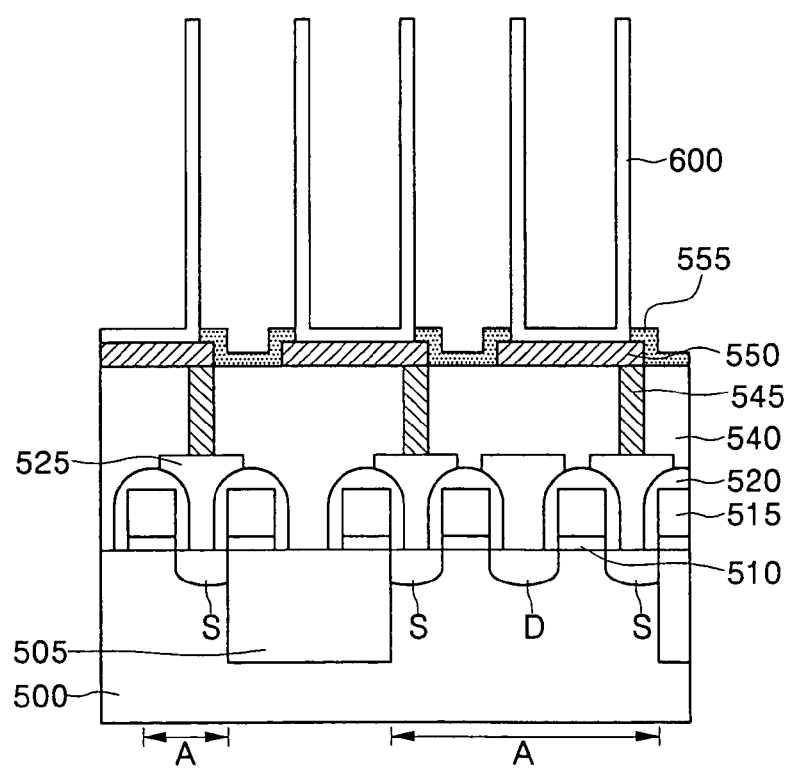
FIG. 5B is a sectional view taken along a line of II-II' of FIG. 5A.

FIG. 5A is a plan view illustrating a structure of a semiconductor device having box-shaped cylindrical storage nodes, and FIG. 5B is a sectional view taken along a line of II-II' of FIG. 5A.

Referring to FIGS. 5A and 5B, a device isolation layer 505 is formed to isolate active regions A inside a semiconductor substrate 500. The active regions A are aligned at uniform intervals, and each region has a major axis L1 and a minor axis L2. The device isolation layer 505 may be a trench device isolation structure. A gate insulating layer 510 is disposed on the semiconductor substrate 500 having the device isolation layer 505 formed thereon. Gate electrodes 515 are disposed on the gate insulating layer 510. The gate electrodes 515 are disposed to intersect above the active regions A. A gate protecting layer 520 is disposed on the semiconductor substrate 500 having the gate electrodes 515 formed thereon. Source regions S and drain regions D are disposed between the gate electrodes 515 inside the active regions A. Contact electrodes 525 are disposed between pairs of the gate electrodes 515 in the active regions A, being in contact with the source regions S and the drain regions D respectively. An interlayer insulating layer 540 is disposed to cover the contact electrodes 525. Buried contact plugs 545 are disposed to penetrate the interlayer insulating layer 540, respectively being in contact with the contact electrodes 525 on the source regions S. Beneficially, buffer conductive layer patterns 550 may be disposed on the semiconductor substrate 500 having the buried contact plugs 545 formed thereon. The buffer conductive layer patterns 550 are disposed to contact the buried contact plugs 545 respectively, and each of the buffer conductive layer patterns 550 has a greater width than that of the corresponding buried contact plug 545. Box-shaped cylindrical storage nodes 600 are disposed to extend upwardly, being in contact with the buffer conductive layer patterns 550. As can be seen in the plan view of FIG. 5A, illustrating the box-shaped cylindrical storage nodes 600, a pair of facing vertices are placed in parallel with the major axis L1 of the active region. Further, as can be seen in the plan view of FIG. 5A showing the box-shaped cylindrical storage nodes 600, the storage nodes 600 may have a rectangular shape or rhombus shape. Etch stop layer patterns 555 may be disposed on the interlayer insulating layer 540 and portions of the buffer conductive layer patterns 550 under the outer sidewalls of the box-shaped cylindrical storage nodes 600 respectively.

According to the present invention as described above, box-shaped cylindrical storage nodes for a semiconductor device are fabricated by the method of making line-and-space type patterns being placed across each other (i.e., oriented at an angle with respect to each other, when viewed from above). Therefore, the surface area of the storage nodes can be increased by about 25% within the limited area in comparison with the conventional storage nodes fabricated by the contact method, thereby increasing the capacitance of the capacitor. Further, the intervals between the storage nodes are maintained uniform, thereby preventing the generation of bridge defects.

What is claimed is:

1. A method of fabricating a semiconductor device, comprising:
   forming an interlayer insulating layer on a semiconductor substrate;
   forming buried contact plugs penetrating the interlayer insulating layer;
   sequentially forming a molding layer and a photoresist layer on the semiconductor substrate having the buried contact plugs formed thereon;
   exposing the photoresist layer using a first phase shift mask having line-and-space type patterns, to form first exposure regions;
   exposing the photoresist layer having the first exposure regions, using a second phase shift mask having line-and-space type patterns, to form second exposure regions intersecting the first exposure regions;
   developing the photoresist layer having the first and the second exposure regions, to form a photoresist pattern having rectangular-shaped openings, the rectangular-shaped openings being formed at cross points of the first and the second exposure regions;
   using the photoresist pattern in a process of etching the molding layer to form storage node holes exposing the buried contact plugs; and
   forming storage nodes inside the storage node holes.

2. The method of claim 1, further comprising after forming the molding layer, forming a hard mask layer on the molding layer, and wherein using the photoresist pattern in the process of etching the molding layer to form the storage node holes exposing the buried contact plugs comprises,
   patterning the hard mask layer using the photoresist pattern as an etch mask, to form a hard mask pattern; and
   etching the molding layer using the hard mask pattern as an etch mask to form the storage node holes exposing the buried contact plugs.

3. The method according to claim 2, wherein the hard mask layer is formed of a material layer having an etch selectivity relative to the molding layer.

4. The method according to claim 1, wherein a thickness of one of the first exposure regions and the second exposure regions is smaller than a thickness of the photoresist layer, and a thickness of the overlapping exposure regions of the first exposure regions and the second exposure regions is the same as the thickness of the photoresist layer.

5. The method according to claim 1, wherein the pattern intervals of the line-and-space type patterns in the first phase shift mask and the second phase shift mask are the same.

6. The method according to claim 1, further comprising, after forming the buried contact plugs, forming buffer conductive layer patterns on the semiconductor substrate having the buried contact plugs formed thereon, the buffer conductive layer patterns being in contact with the buried contact plugs and having a wider area than the buried contact plugs.

7. The method according to claim 1, further comprising, after forming the buried contact plugs, forming an etch stop layer on the semiconductor substrate having the buried contact plugs, and
   wherein forming the storage node holes comprises sequentially etching the molding layer and the etch stop layer, to form storage node holes exposing the buried contact plugs.

8. The method according to claim 1, further comprising, after forming the storage node holes, cleaning the inside of the storage node holes using a wet cleaning solution.

9. A method of fabricating a semiconductor device, comprising:
   forming an interlayer insulating layer on a semiconductor substrate;
   forming buried contact plugs penetrating the interlayer insulating layer;
   sequentially forming a molding layer, a first hard mask layer, and a second hard mask layer on the semiconductor substrate having the buried contact plugs formed thereon;
   patterning the second hard mask layer, to form line-and-space type upper hard mask patterns;
   patterning the first hard mask layer to form line-and-space type lower hard mask patterns, wherein the lines of the lower hard mask patterns are arranged at an angle with respect to the lines of the upper hard mask pattern when viewed from a plan view, above;
   etching the molding layer using the upper and the lower hard mask patterns as etch masks to form storage node holes exposing the buried contact plugs; and
   forming storage nodes inside the storage node holes.

10. The method according to claim 9, wherein the pattern intervals of the line-and-space type patterns in the lower hard mask patterns and the upper hard mask patterns are the same.

11. The method according to claim 9, wherein the first hard mask layer is formed of a material layer having an etch selectivity relative to the molding layer.

12. The method according to claim 9, wherein the second hard mask layer is formed of a material layer having an etch selectivity relative to the molding layer.

13. The method according to claim 9, wherein the second hard mask layer is formed of a material layer having an etch selectivity relative to the first hard mask layer.

14. The method according to claim 9, further comprising, after forming the buried contact plugs, forming buffer conductive layer patterns on the semiconductor substrate having the buried contact plugs formed thereon, the buffer conductive layer patterns being in contact with the buried contact plugs and having a wider area than the buried contact plugs, and
   wherein forming the storage node holes comprises etching the molding layer using the upper and the lower hard mask patterns as etch masks to form the storage node holes exposing the buffer conductive layer patterns.

15. The method according to claim 9, further comprising, after forming the buried contact plugs, forming an etch stop layer on the semiconductor substrate having the buried contact plugs, and wherein forming the storage node holes comprises sequentially etching the molding layer and the etch stop layer using the upper and the lower hard mask patterns as etch masks, to form storage node holes exposing the buried contact plugs.

16. The method according to claim 9, further comprising, after forming the storage node holes, cleaning the inside of the storage node holes using a wet cleaning solution.

17. A method of fabricating a semiconductor device, comprising:

forming an interlayer insulating layer on a semiconductor substrate;

forming buried contact plugs penetrating the interlayer insulating layer;

sequentially forming a molding layer and a hard mask layer on the semiconductor substrate having the buried contact plugs formed thereon;

patterning the hard mask layer to form line-and-space type hard mask patterns;

forming a photoresist layer on the semiconductor substrate having the hard mask patterns;

patterning the photoresist layer to form line-and-space type photoresist patterns, wherein the lines of the photoresist patterns are arranged at an angle with respect to the lines of the hard mask pattern when viewed from a plan view, above;

etching the molding layer using the photoresist patterns and the hard mask patterns as etch masks to form storage node holes exposing the buried contact plugs; and forming storage nodes inside the storage node holes.

18. The method according to claim 17, wherein the pattern intervals of the line-and-space type patterns in the photoresist patterns and the hard mask patterns are same.

19. The method according to claim 17, wherein the hard mask patterns are formed of a material layer having an etch selectivity relative to the molding layer.

20. The method according to claim 17, further comprising, after forming the buried contact plugs, forming buffer conductive layer patterns on the semiconductor substrate having the buried contact plugs formed thereon, the buffer conductive layer patterns being in contact with the buried contact plugs and having a wider area than the buried contact plugs, and wherein forming the storage node holes comprises etching the molding layer using the photoresist patterns and the hard mask patterns as etch masks, to form the storage node holes exposing the buffer conductive layer patterns.

21. The method according to claim 17, further comprising, after forming the buried contact plugs, forming an etch stop layer on the semiconductor substrate having the buried contact plugs, and wherein forming the storage node holes comprises sequentially etching the molding layer and the etch stop layer using the photoresist patterns and the hard mask patterns as etch masks, to form the storage node holes exposing the buried contact plugs.

22. The method according to claim 17, after forming the storage node holes, the method further comprising cleaning the inside of the storage node holes using a wet cleaning solution.

* * * * *